(12) United States Patent
Huang et al.

(10) Patent No.: US 10,134,604 B1
(45) Date of Patent: Nov. 20, 2018

(54) SEMICONDUCTOR DEVICE AND METHOD

(71) Applicant: Taiwan Semiconductor Manufacturing Company, Ltd., Hsinchu (TW)

(72) Inventors: Ming-Jie Huang, Hsinchu (TW); Syun-Ming Jang, Hsinchu (TW); Ryan Chia-Jen Chen, Chiayi (TW); Ming-Ching Chang, Hsinchu (TW); Shu-Yuan Ku, Zhubei (TW); Tai-Chun Huang, Hsinchu (TW); Chunyao Wang, Zhubei (TW); Tze-Liang Lee, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/725,625

(22) Filed: Oct. 5, 2017

Related U.S. Application Data

(60) Provisional application No. 62/491,805, filed on Apr. 28, 2017.

(51) Int. Cl.
| | |
|---|---|
| *H01L 21/3205* | (2006.01) |
| *H01L 29/66* | (2006.01) |
| *H01L 29/49* | (2006.01) |
| *H01L 21/28* | (2006.01) |
| *H01L 29/78* | (2006.01) |
| *H01L 29/10* | (2006.01) |

(52) U.S. Cl.
CPC .. *H01L 21/32053* (2013.01); *H01L 21/28052* (2013.01); *H01L 29/1033* (2013.01); *H01L 29/4975* (2013.01); *H01L 29/6681* (2013.01); *H01L 29/66545* (2013.01); *H01L 29/7856* (2013.01)

(58) Field of Classification Search
CPC ........... H01L 21/32053; H01L 29/1033; H01L 29/6681; H01L 29/7856; H01L 29/4975; H01L 29/66545
See application file for complete search history.

(56) References Cited

U.S. PATENT DOCUMENTS

| | | | |
|---|---|---|---|
| 8,551,843 B1 * | 10/2013 | Cai | H01L 21/28123 257/E21.19 |
| 9,646,967 B2 * | 5/2017 | Kim | H01L 27/0886 |
| 2013/0102138 A1 * | 4/2013 | Yeh | H01L 21/82380 438/585 |

(Continued)

*Primary Examiner* — Benjamin Sandvik
*Assistant Examiner* — Farid Khan
(74) *Attorney, Agent, or Firm* — Slater Matsil, LLP

(57) ABSTRACT

A method includes forming a metal gate structure over a first fin, where the metal gate structure is surrounded by a first dielectric material, and forming a capping layer over the first dielectric material, where an etch selectivity between the metal gate structure and the capping layer is over a predetermined threshold. The method also includes forming a patterned hard mask layer over the first fin and the first dielectric material, where an opening of the patterned hard mask layer exposes a portion of the metal gate structure and a portion of the capping layer. The method further includes removing the portion of the metal gate structure exposed by the opening of the patterned hard mask layer.

20 Claims, 39 Drawing Sheets

(56) References Cited

U.S. PATENT DOCUMENTS

| | | | |
|---|---|---|---|
| 2013/0164930 A1* | 6/2013 | Tu | H01L 21/31053 438/595 |
| 2013/0168816 A1* | 7/2013 | Kang | H01L 27/0629 257/536 |
| 2016/0099181 A1* | 4/2016 | Tung | H01L 21/82382 257/369 |
| 2016/0104645 A1* | 4/2016 | Hung | H01L 21/82343 257/401 |
| 2016/0293728 A1* | 10/2016 | Seo | G03F 7/2002 |

* cited by examiner

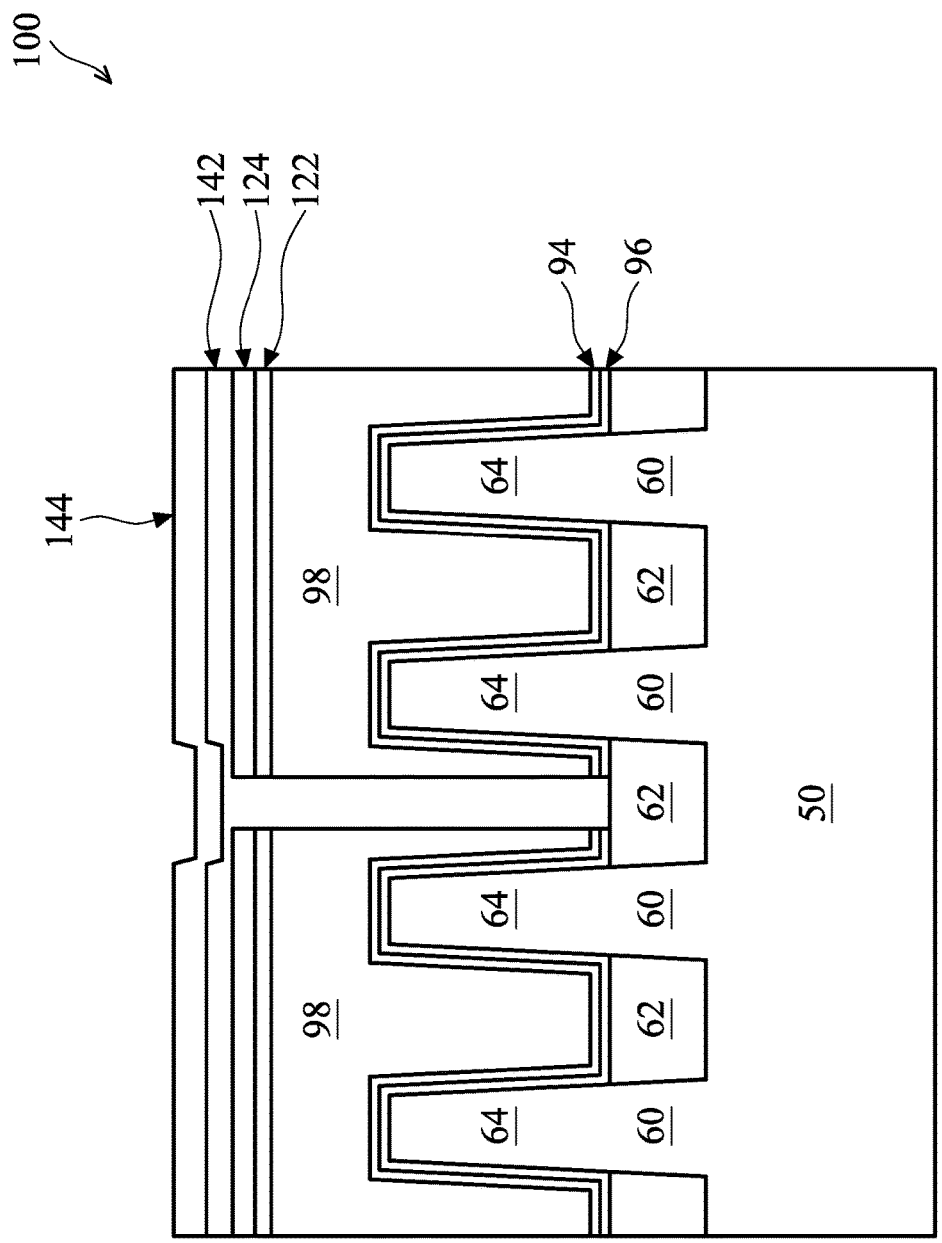

SEMICONDUCTOR DEVICE AND METHOD

PRIORITY CLAIM AND CROSS-REFERENCE

This application claims priority to U.S. Provisional Patent Application No. 62/491,805, filed Apr. 28, 2017, entitled "Semiconductor Device and Method," which application is hereby incorporated by reference in its entirety

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of reducing the loss of the inter-layer dielectric (ILD) layer of a FinFET device during device fabrication.

Figure 1:
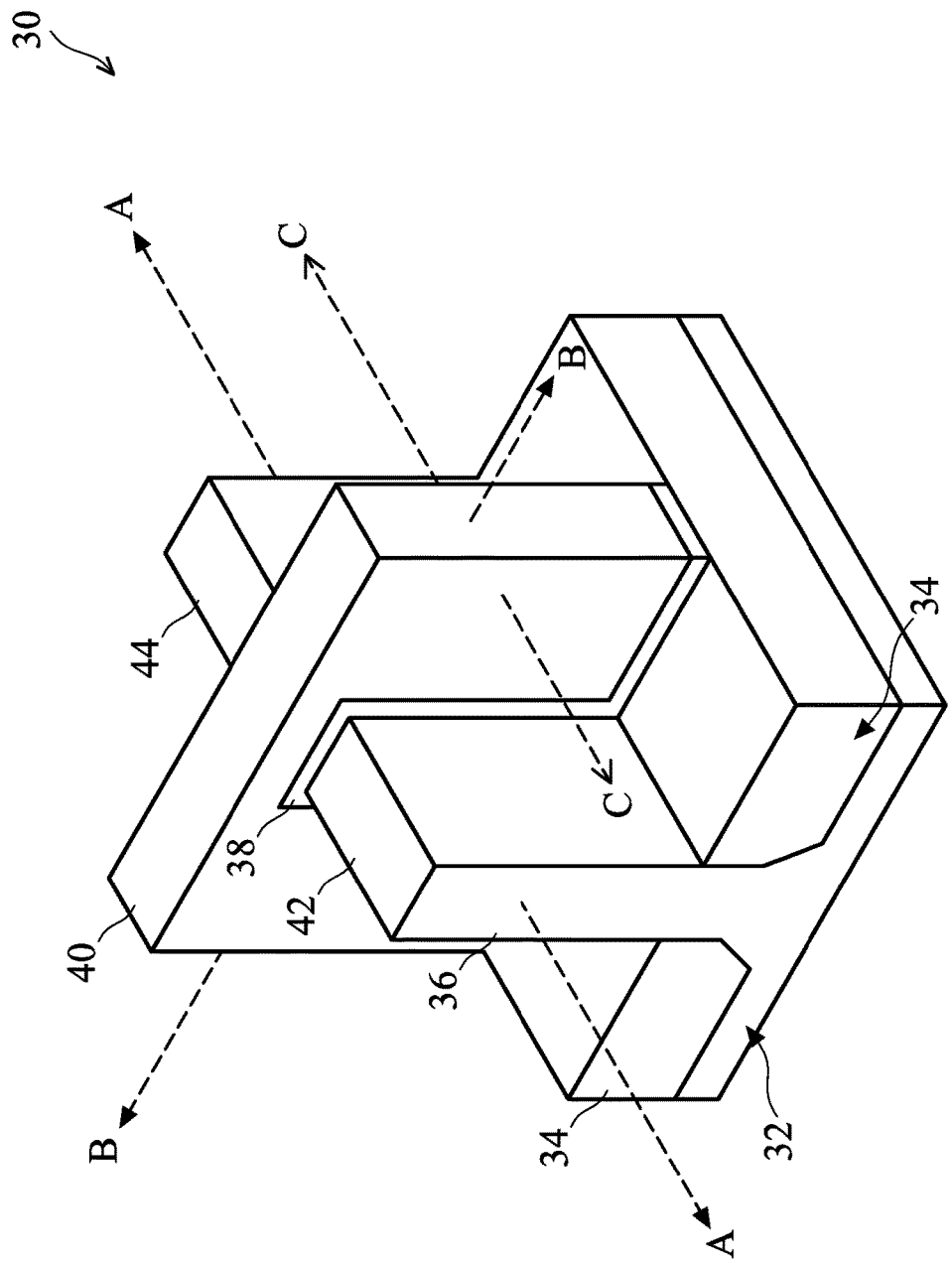
FIG. 1 is a perspective view of a Fin Field-Effect Transistor (FinFET), in accordance with some embodiments.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate electrode 40 (also referred to as a gate) is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section A-A is perpendicular to cross-section B-B and is along a longitudinal axis of the fin 36 and in a direction of, for example, a current flow between the source/drain regions 42 and 44. Cross-section C-C is parallel to cross-section A-A and is outside fin 36. Cross-sections A-A, B-B, and C-C are also illustrated in the plan view of FIG. 9. Subsequent figures refer to these reference cross-sections for clarity.

Figure 6:
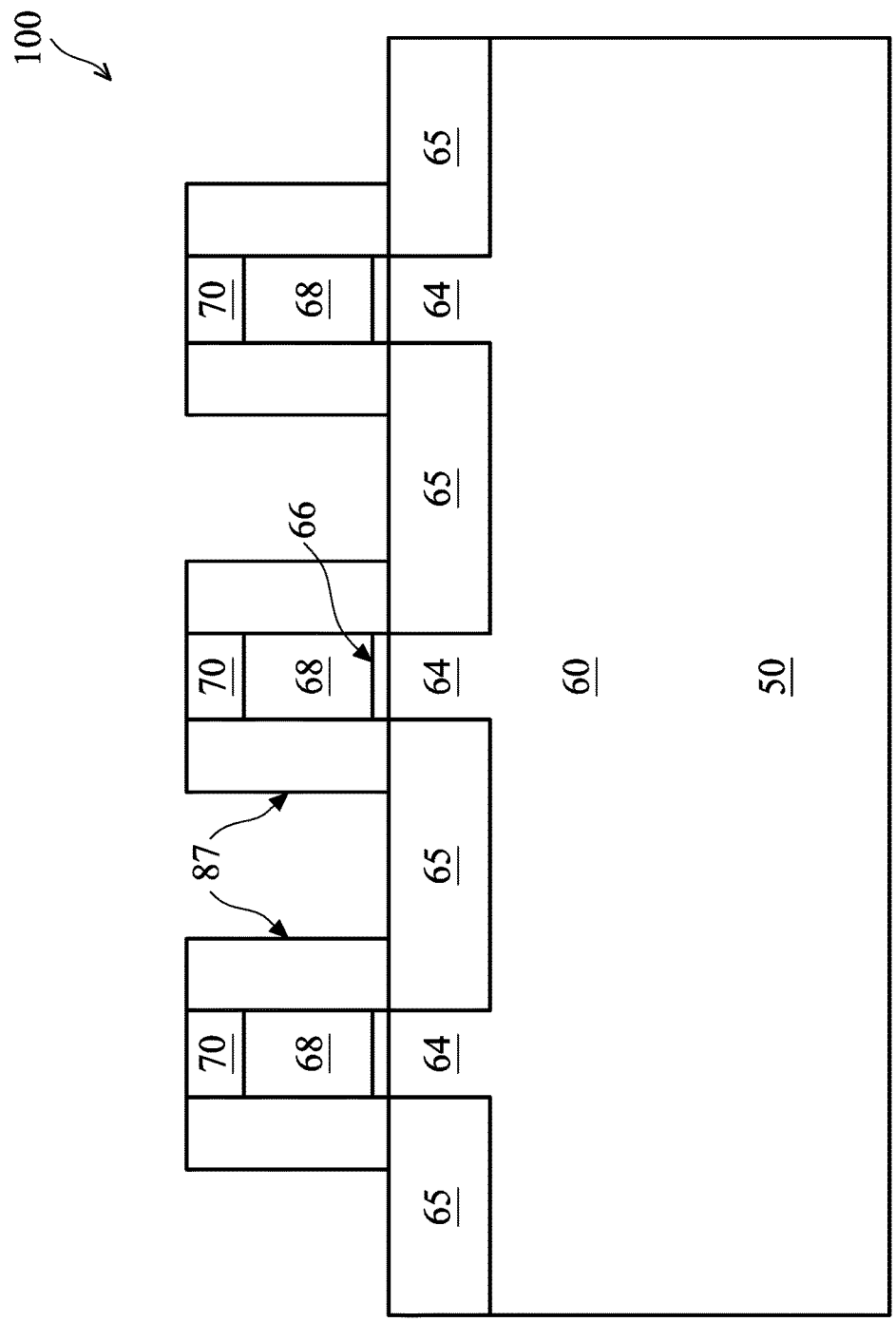
Figure 7:
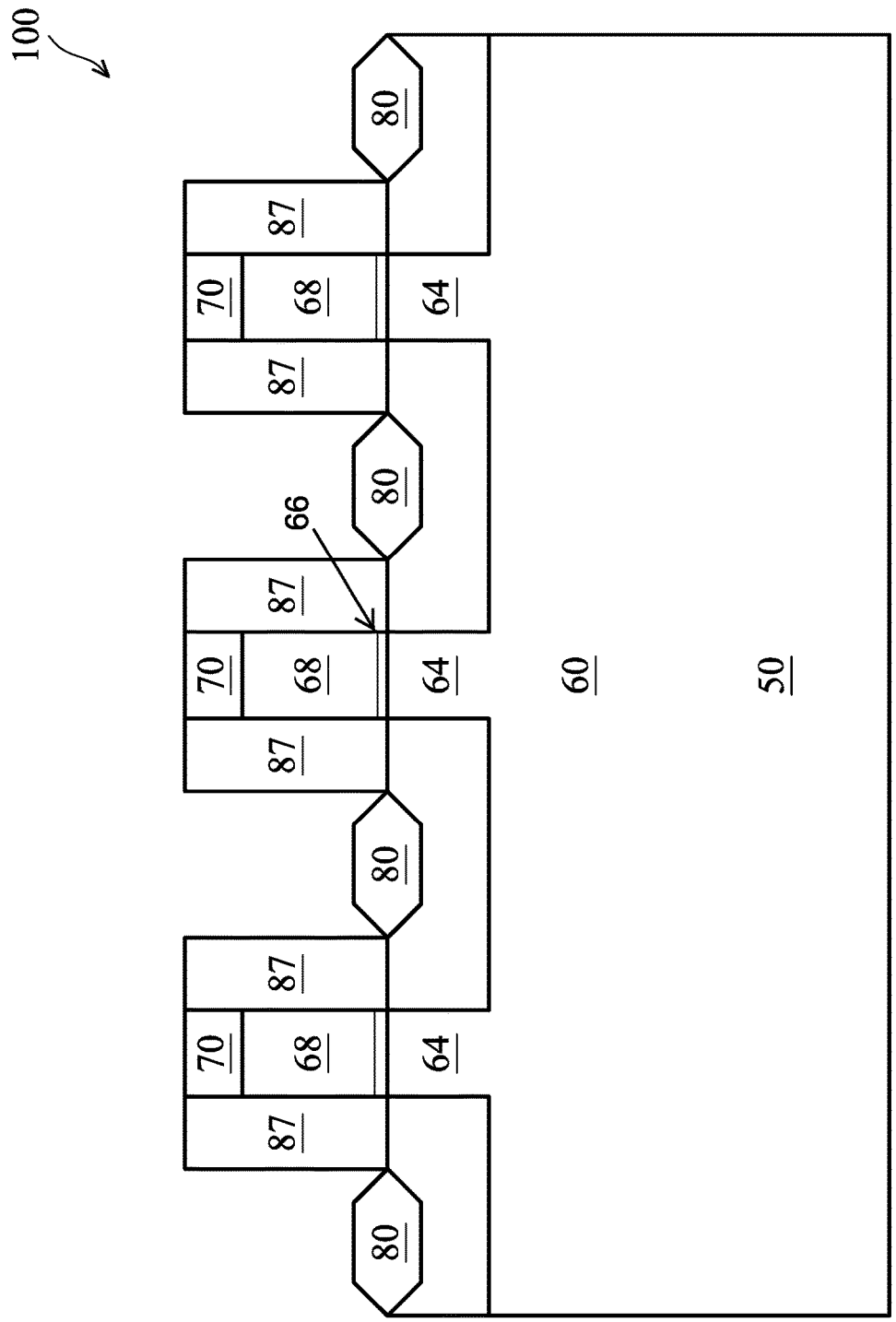
Figure 8:
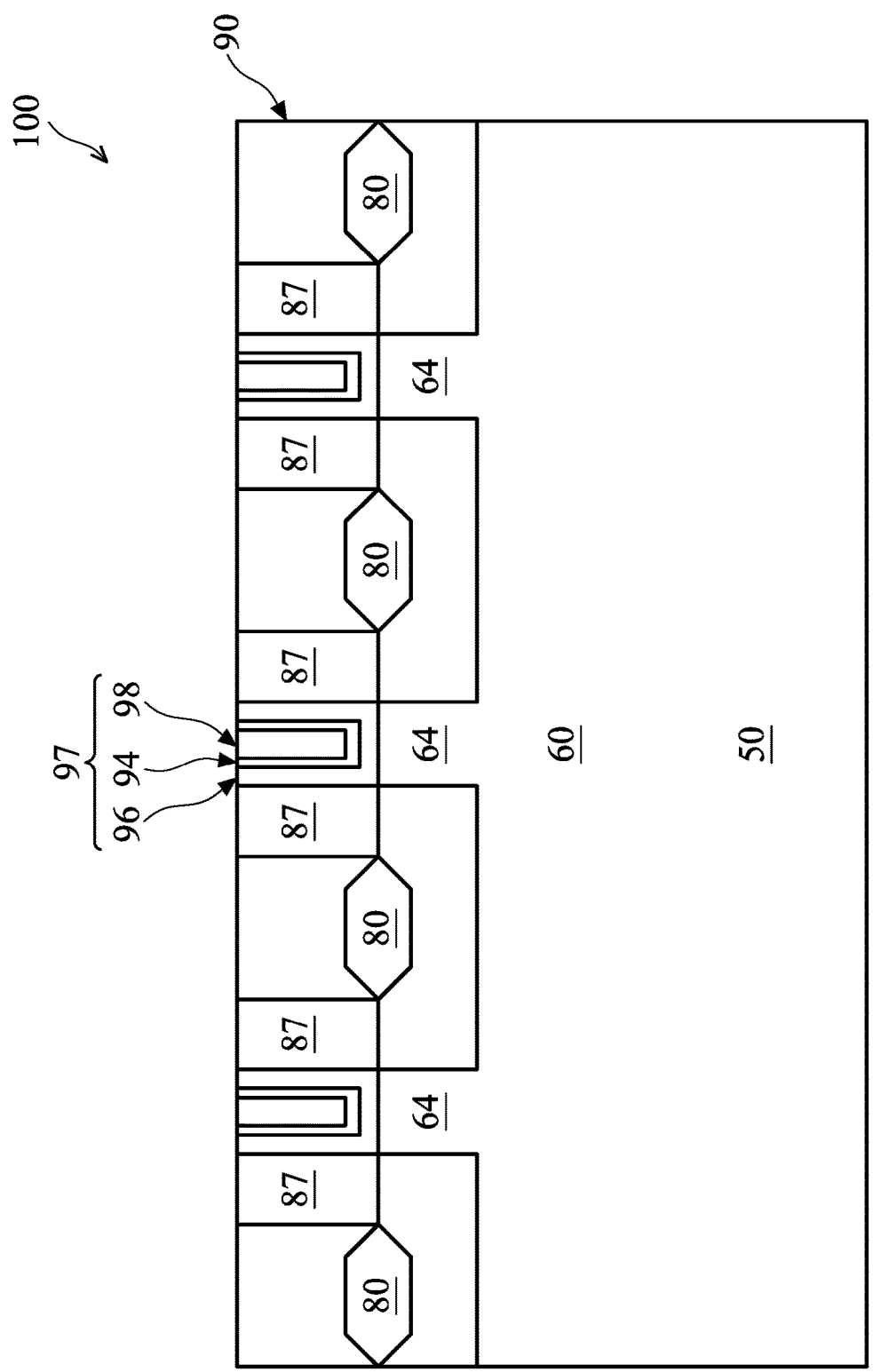
Figure 9:
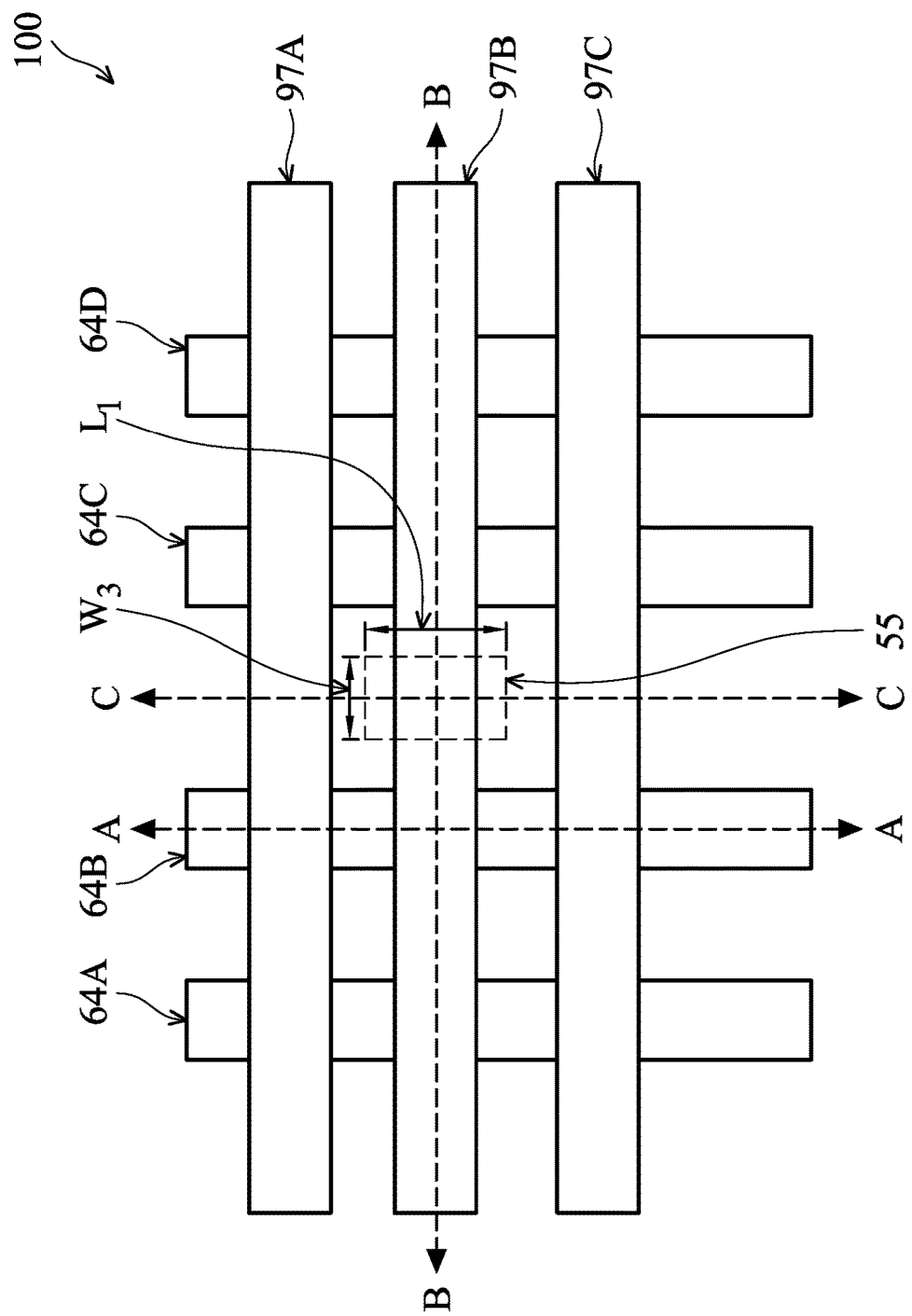

FIGS. 2-18B illustrate various views (e.g., cross-sectional view, plan view) of a FinFET device 100 at various stages of fabrication in accordance with some embodiments. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6-8 illustrate cross-sectional views of the FinFET device 100 along cross-section A-A. FIG. 9 is a plan view of the FinFET device 100. FIGS. 10A-18B illustrate cross-sectional views of the FinFET device 100 along different cross-sections at various stages of fabrication, where figures with the same numerals (e.g., 10A and 10B) illustrate cross-sectional views of the FinFET device 100 at a same stage of processing. In particular, FIGS. 10A, 11A, 12A, 13A, 14A, 15A, and 16A illustrate cross-sectional views of the FinFET device 100 along cross-section C-C, FIGS. 17A and 18A illustrate cross-sectional views of the FinFET device 100 along cross-section A-A, and FIGS. 10B, 11B, 12B, 13B, 14B, 15B, 16B, 17B, and 18B illustrate cross-sectional views of the FinFET device 100 along cross-section B-B.

Figure 2:
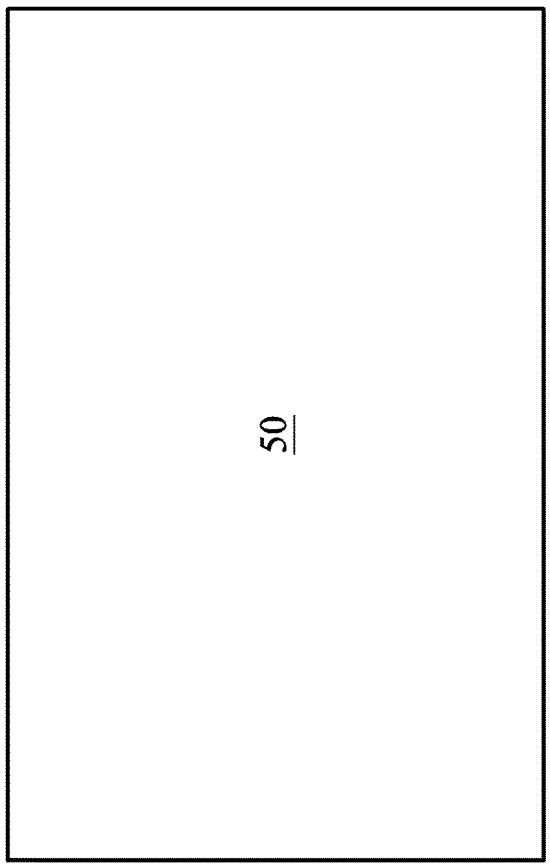
FIGS. 2-18B illustrate various views (e.g., cross-sectional view, plan view) of a FinFET device at various stages of fabrication, in accordance with an embodiment.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
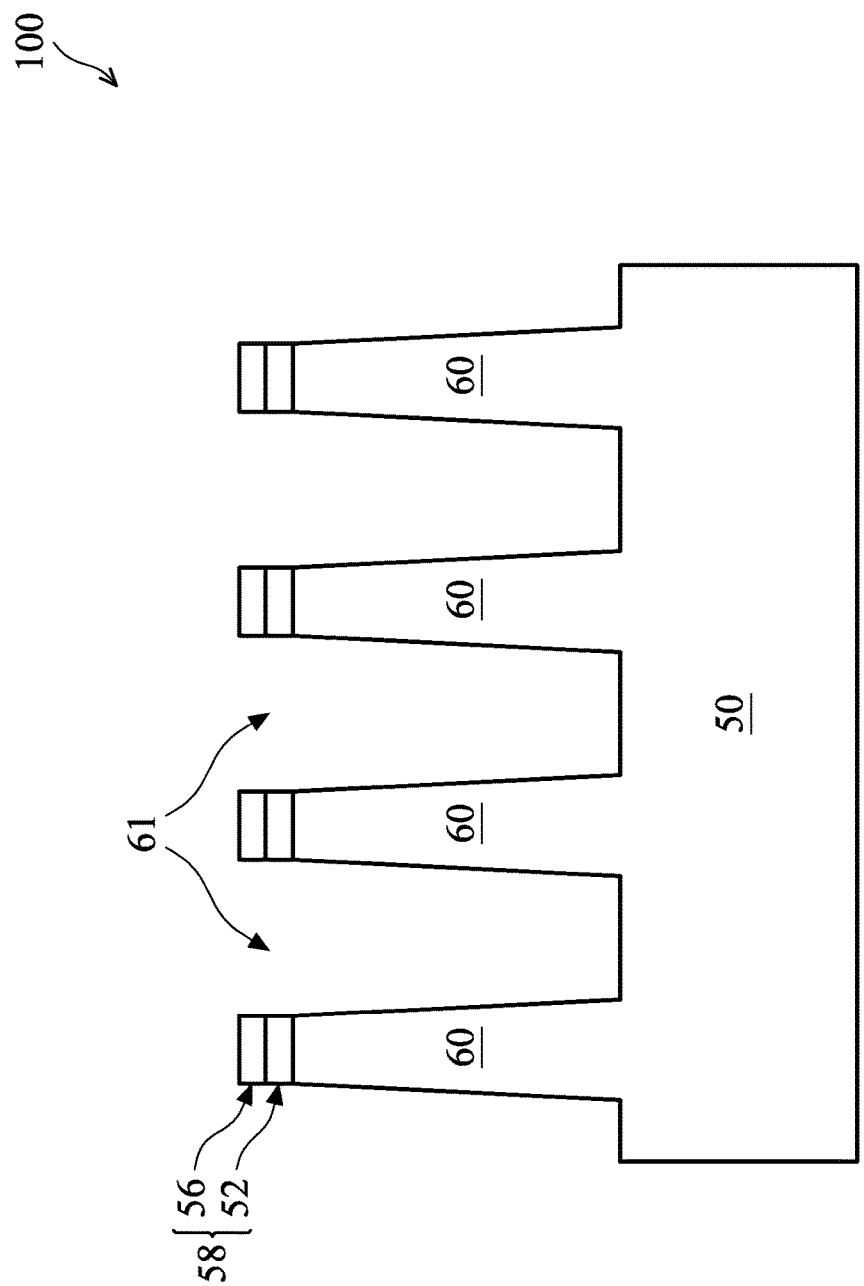

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask 58 may be removed by etching or any suitable method.

Figure 4:
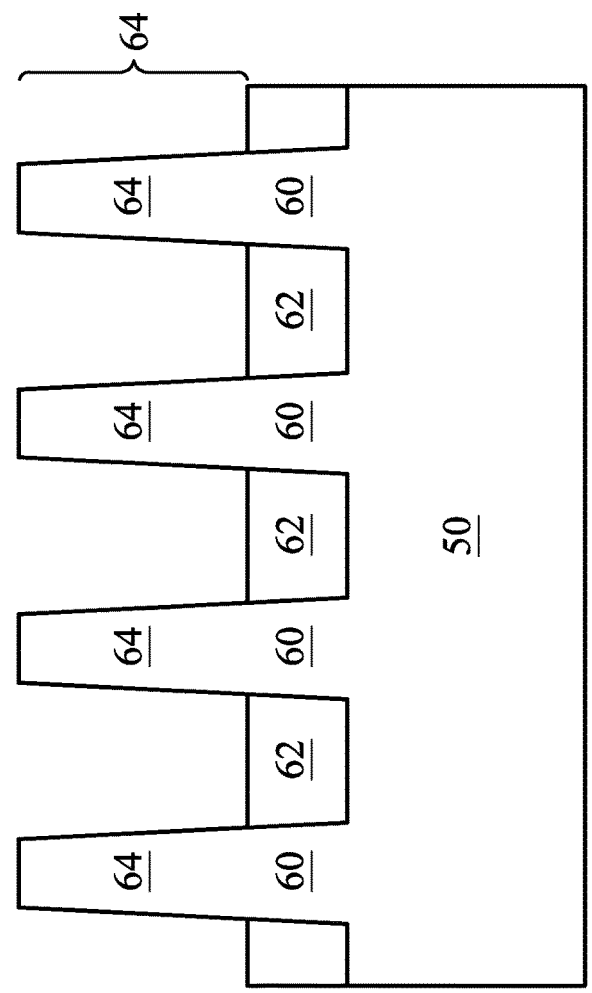

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
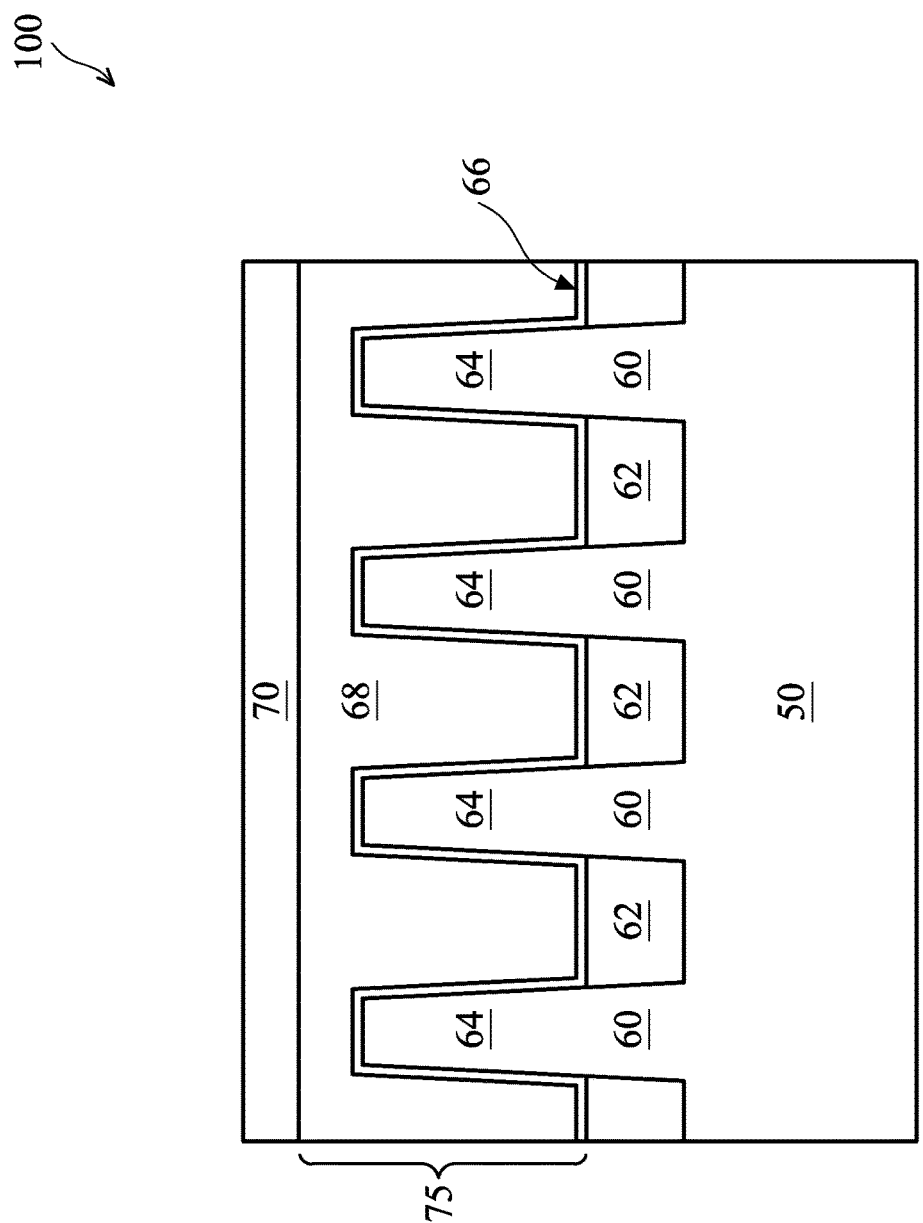

FIG. 5 illustrates the formation of a dummy gate structure 75 over the semiconductor fins 64. The dummy gate structure 75 includes gate dielectric 66 and gate 68, in some embodiments. The dummy gate structure 75 may further include mask 70. The dummy gate structure 75 may be formed by patterning a mask layer, a gate layer and a gate dielectric layer, where the mask layer, the gate layer and the gate dielectric layer comprise a same material as the mask 70, the gate 68, and the gate dielectric 66, respectively. To form the dummy gate structure 75, the gate dielectric layer is formed on the semiconductor fins 64 and the isolation regions 62. The gate dielectric layer may be, for example, silicon oxide, silicon nitride, multilayers thereof, or the like, and may be deposited or thermally grown according to acceptable techniques. In some embodiments, the gate dielectric layer may be a high-k dielectric material, and in these embodiments, the gate dielectric layer may have a k value greater than about 7.0, and may include a metal oxide or a silicate of Hf, Al, Zr, La, Mg, Ba, Ti, Pb, multilayers thereof, and combinations thereof. The formation methods of the gate dielectric layer may include molecular-beam deposition (MBD), atomic layer deposition (ALD), plasma-enhanced CVD (PECVD), and the like.

The gate layer is formed over the gate dielectric layer, and the mask layer is formed over the gate layer. The gate layer may be deposited over the gate dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the gate dielectric layer, the gate layer, and the mask layer are formed, the mask layer may be patterned using acceptable photolithography and etching techniques to form mask 70. The pattern of the mask 70 then may be transferred to the gate layer and the gate dielectric layer by a suitable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64. Although one gate structure 75 is illustrated in the cross-sectional view of FIG. 5, more than one gate structures 75 may be formed over the semiconductor fins 64. For example, the plan view in FIG. 9 illustrates three metal gates 97 over the semiconductor fins 64.

FIGS. 6-8 illustrate the cross-section views of further processing of the FinFET device 100 along cross-section A-A (along a longitudinal axis of the fin). As illustrated in FIG. 6, lightly doped drain (LDD) regions 65 are formed in the fins 64. The LDD regions 65 may be formed by an implantation process. The implantation process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate 68 and on opposing sidewalls of the gate dielectric 66. The gate spacers 87 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The gate spacers 72 may also extend over the upper surface of the semiconductor fins 64 and the upper surface of the isolation region 62.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included in the scope of the present disclosure.

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 of adjacent fins 64 do not merge together and remain separate source/drain regions 80. In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 cm-3 to about 1E21 cm-3. In some embodiments, the epitaxial source/drain regions may be in situ doped during growth.

Next, as illustrated in FIG. 8, a first interlayer dielectric (ILD) 90 is formed over the structure illustrated in FIG. 7, and a gate-last process (sometimes referred to as replacement gate process) is performed. In a gate-last process, the gate 68 and the gate dielectric 66 (see FIG. 7) are considered dummy structures and are removed and replaced with an active gate and active gate dielectric, which may be collectively referred to as a replacement gate.

In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to planarize the top surface of the first ILD 90, such that the top surface of the first ILD 90 is level with the top surface of the gate 68 (see FIG. 7) after the CMP process. Therefore, after the CMP process, the top surface of the gate 68 is exposed, in some embodiments.

In accordance with some embodiments, the gate 68 and the gate dielectric 66 directly under the gate 68 are removed in an etching step(s), so that recesses (not shown) are formed. Each recess exposes a channel region of a respective fin 64. Each channel region may be disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Next, in FIG. 8, metal gates 97 are formed in the recesses by forming a gate dielectric layer 96, a barrier layer 94, and a gate electrode 98 successively in each of the recesses. As illustrated in FIG. 8, the gate dielectric layer 96 is deposited conformally in the recesses. The barrier layer 94 is formed conformally over the gate dielectric layer 96, and the gate electrode 98 fills the recesses. Although not shown, a work function layer may be formed, e.g., between the gate dielectric layer 96 and the barrier layer 94.

In accordance with some embodiments, the gate dielectric layer 96 comprises silicon oxide, silicon nitride, or multi-layers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

The work function layer may be formed conformally over the gate dielectric layer 96. The work layer comprises any suitable material for a work function layer. Exemplary p-type work function metals that may be included in the metal gate 97 include TiN, TaN, Ru, Mo, Al, WN, ZrSi2, MoSi2, TaSi2, NiSi2, WN, other suitable p-type work function materials, or combinations thereof. Exemplary n-type work function metals that may be included in the metal gate 97 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a target threshold voltage Vt is achieved in the device that is to be formed in the respective region. The work function layer(s) may be deposited by CVD, PVD, ALD, and/or other suitable process.

Next, the barrier layer 94 is formed conformally over the gate dielectric layer 96 and, if present, over the work function layer. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as PECVD. However, other alternative processes, such as sputtering or MOCVD, ALD, may alternatively be used.

Next, the gate electrode 98 is formed over the barrier layer 94. The gate electrode 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work function layer, the barrier layer 94, and the material of the gate electrode 98, which excess portions are over the top surface of the first ILD 90. The resulting remaining portions of material of the gate electrode 98, the barrier layer 94, the work function layer (not shown), and the gate dielectric layer 96 thus form metal gates 97 of the resulting FinFET device 100. Three metal gates 97 are illustrated in the example of FIG. 8. However, more or less than three metal gates 97 may be used to form the FinFET device 100, as skilled artisans readily appreciate.

Referring now to FIG. 9, a plan view of the FinFET device 100 after the processing step of FIG. 8 is illustrated. For simplicity, not all features of the FinFET device 100 are illustrated. For example, the gate spacers 87, the isolation regions 62, and the source/drain regions 80 are not illustrated in FIG. 9.

As illustrated in FIG. 9, the metal gates 97 (e.g., 97A/97B/97C) straddle the semiconductor fins 64 (e.g., 64A/64B/64C/64D). In subsequent processing, a metal gate cutting process is performed to cut the metal gate 97B into two separate metal gates 97B_1 and 97B_2 (see, e.g., FIG. 17B). In the illustrated embodiment, a portion of the metal gate 97B in a cut area 55 is removed, thereby separating the metal gate 97B into two separate metal gates. In particular, portions of the metal gate 97B over the semiconductor fins 64A and 64B form a first metal gate, and portions of the metal gate 97B over the semiconductor fins 64C and 64D form a second metal gate. The first metal gate and the second metal gate may be controlled independently, e.g., by applying different control voltages to the first metal gate and the second metal gate.

FIG. 9 illustrates a non-limiting example of the cut area 55. The number of cut areas 55, the size of cut areas 55, and the location of cut areas 55 may be varied to achieve different cutting patterns and to from metal gates with different sizes and patterns. For example, the cut area 55 may be enlarged along cross-section C-C to cut the metal gates 97A and/or the metal gate 97C in one step. As another example, a second cut area may be used along cross-section B-B, e.g., between semiconductor fins 64A and 64B, to cut the metal gates 97B into three separate metal gates that can be controlled independently from each other. These and other variations of the cut areas 55 are fully intended to be included within the scope of the present disclosure. Discussions below use the example of one cut area 55 as illustrated in FIG. 9, with the understanding that any number of cut areas may be used in the fabrication of the FinFET device 100.

Figure 10A:
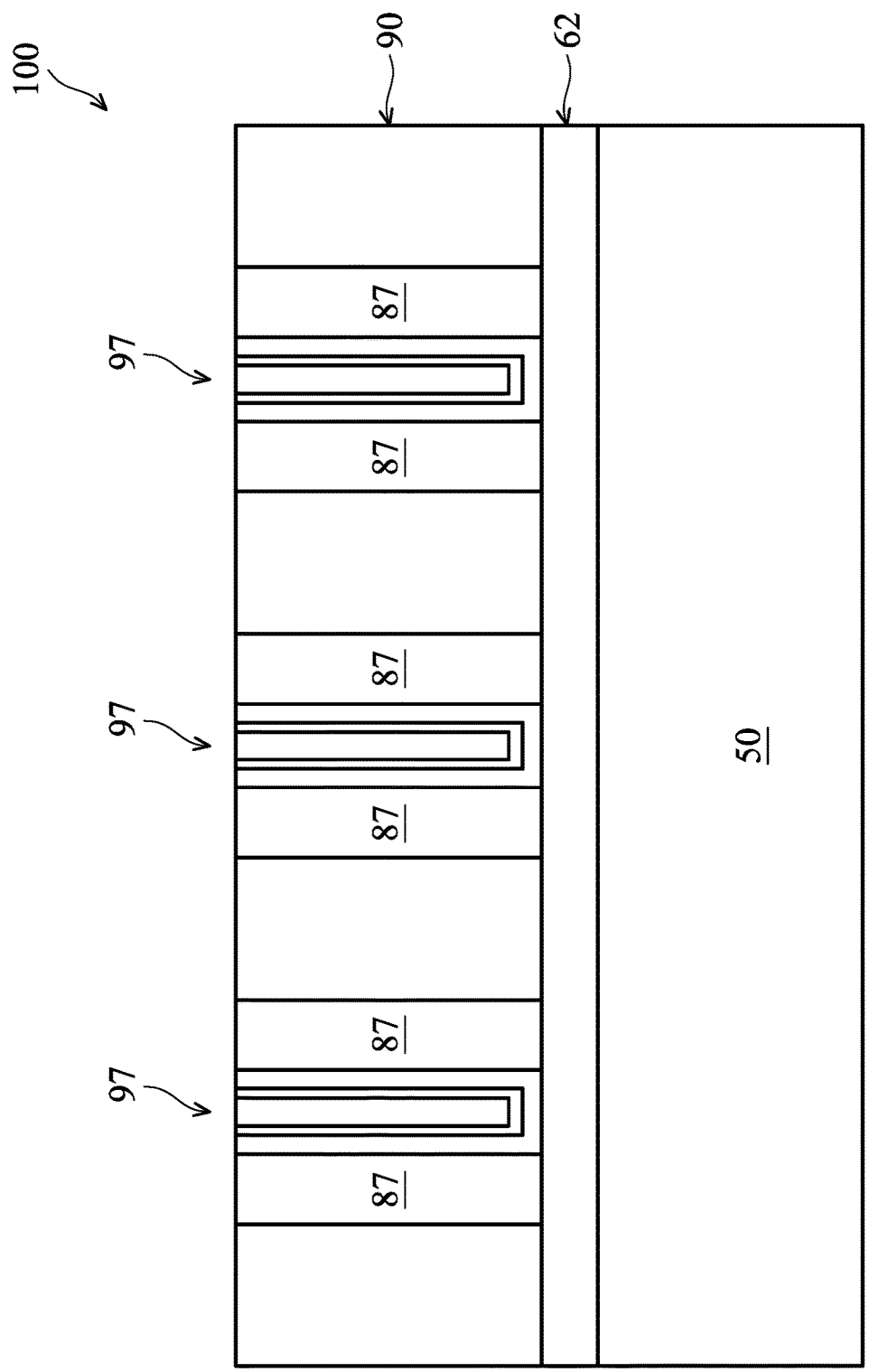
Figure 10B:
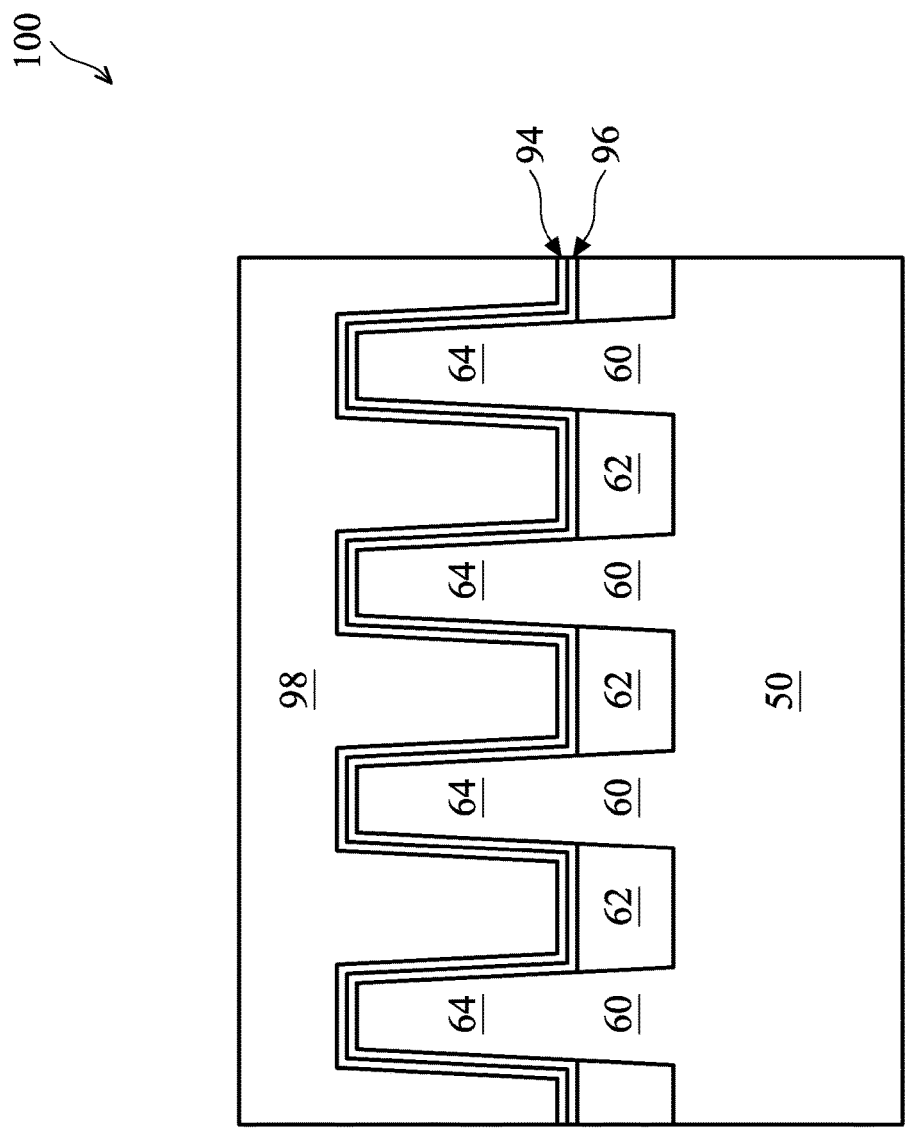

Details of a metal gate cutting process are illustrated in FIGS. 10A-18B, in accordance with an embodiment. FIG. 10A illustrates the cross-sectional view of the FinFET device 100 along cross-section C-C after the processing shown in FIG. 8. As illustrated in FIG. 10A, the metal gates 97 are disposed over the isolation regions 62 and the substrate 50. Gate spacers 87 are on opposing sidewalls of each metal gate 97. The first ILD 90 surrounds the metal gates 97 and the gate spacers 87. Since the cross-section C-C is outside the semiconductor fins 64, features such as the semiconductor fins 64, the source/drain regions 80, and the LDD regions 65 are not visible in the cross-sectional view of FIG. 10A. FIG. 10B illustrates the corresponding cross-sectional view of the FinFET device 100 along cross-section B-B.

Figure 11A:
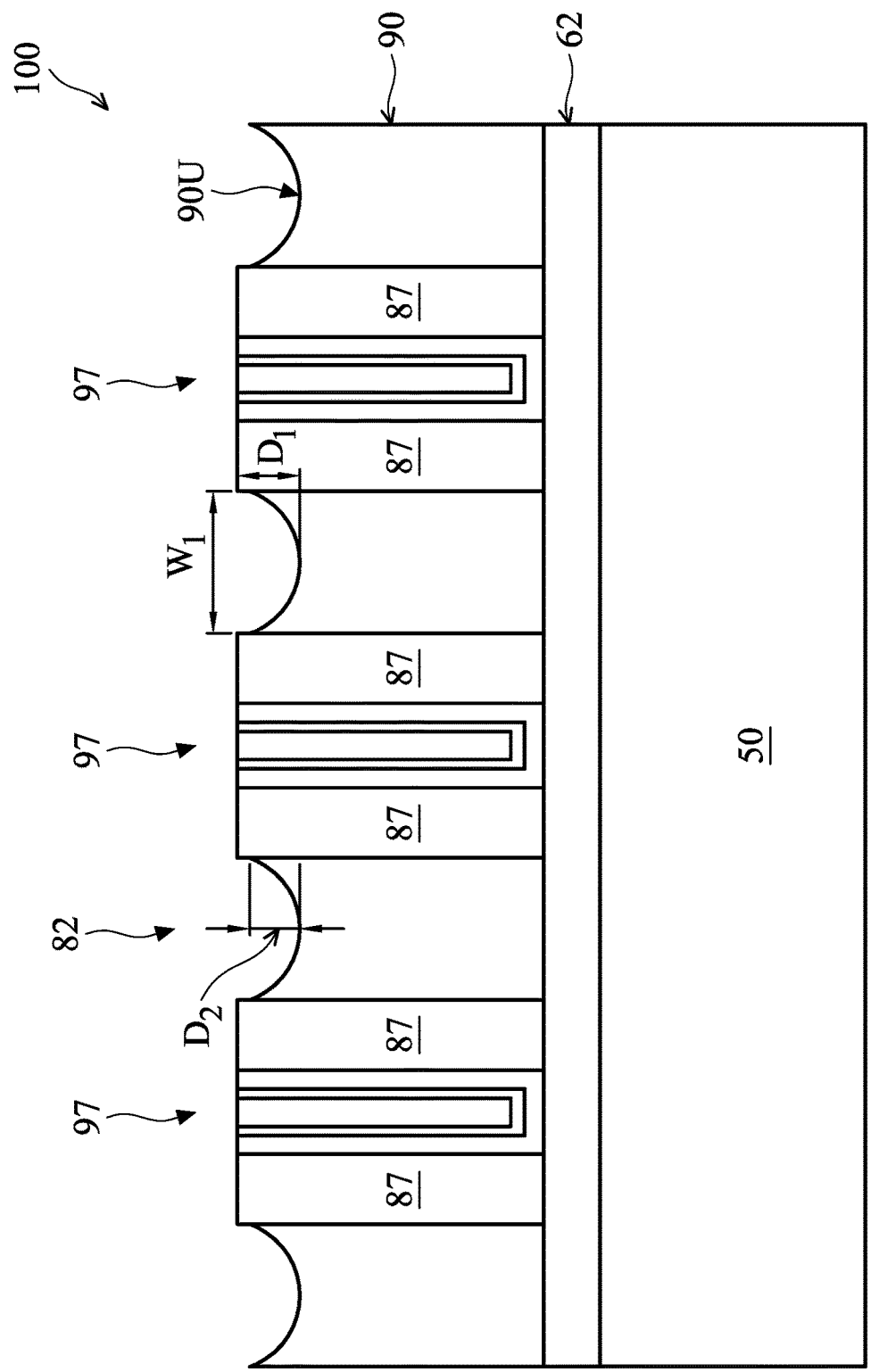
Figure 11B:
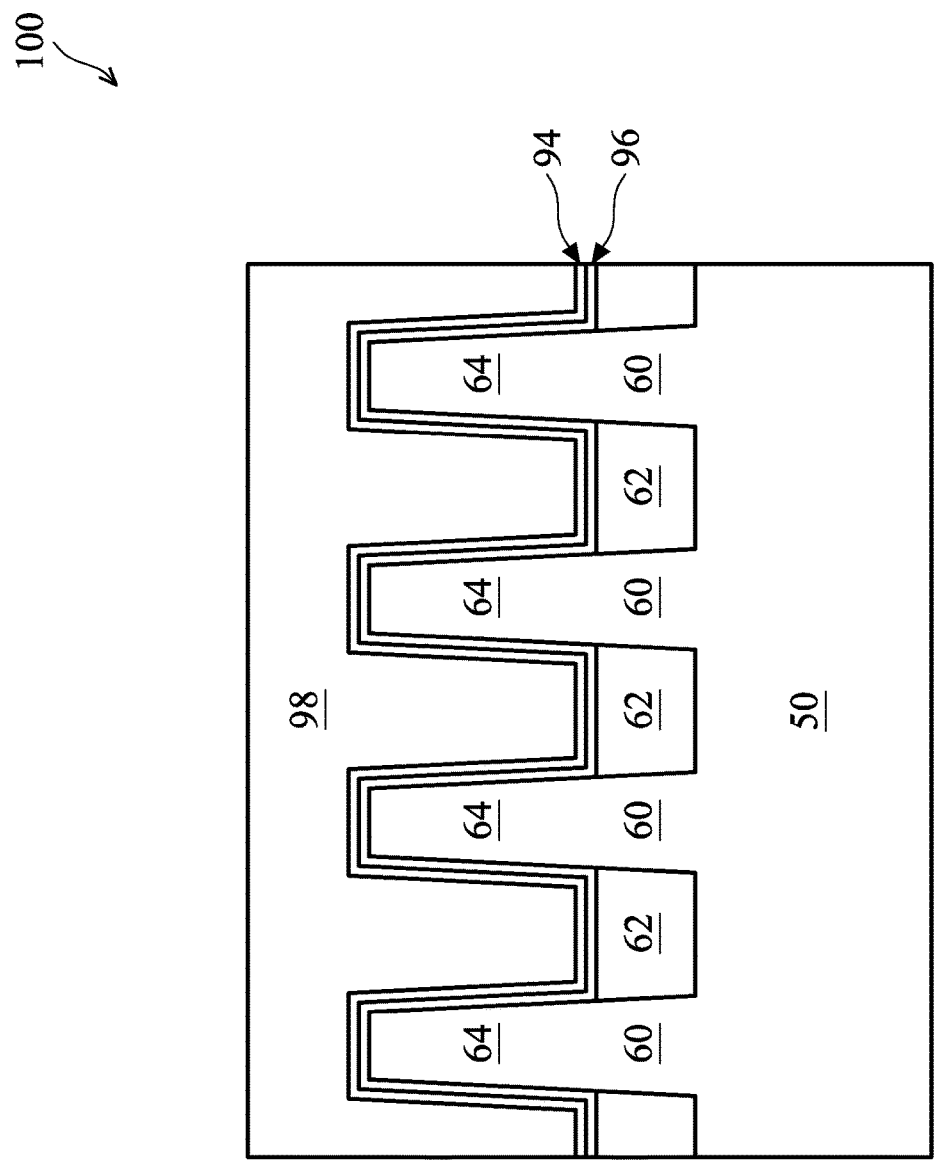

Next, in FIG. 11A, top portions of the first ILD 90 are removed to form recesses 82. In some embodiments, a suitable mask layer (not shown), such as a silicon nitride layer or a photoresist, may be formed over the first ILD 90, the gate spacers 87 and the metal gates 97 and patterned to form openings to expose the first ILD 90. Next, a suitable etching process, such as a dry etch process or a wet etch process, may be performed to remove the top portions of the first ILD 90 to form the recesses 82. After forming the recesses 82, the mask layer may be removed using, e.g., a CMP process. In other embodiments, no mask layer is used for forming the recesses 82. Instead, an etch process using an etchant with a high etch selectivity to the first ILD 90 (e.g., a high etch rate for the first ILD 90) is performed to form the recesses 82 without substantially attacking the gate spacers 87 and the metal gates 97. Since the recesses 82 are formed in the first ILD 90, the recesses 82 are not visible in the cross-sectional view of FIG. 11B.

In some embodiments, a width W1 of the recesses 82 is in a range from about 10 nm to about 60 nm, such as 30 nm. A depth D1 of the recesses 82, measured between the upper surface of the metal gate 97 and a lowest surface of the recesses 82, is in a range from about 10 nm to about 60 nm, such as 30 nm. In the illustrated example, after the recesses 82 are formed in the first ILD 90, the upper surface 90U of the first ILD 90 comprises one or more concave shapes. For example, edges of the upper surface 90U contacting the gate spacers 87 are higher (e.g., farther away from the substrate 50) than a middle point of the upper surface 90U midway between two adjacent metal gates 97. In some embodiments, a distance $D_2$ between the edges of the upper surface 90U and the middle point of the upper surface 90U is in a range from about 10 nm to about 60 nm, such as 30 nm.

Figure 12A:
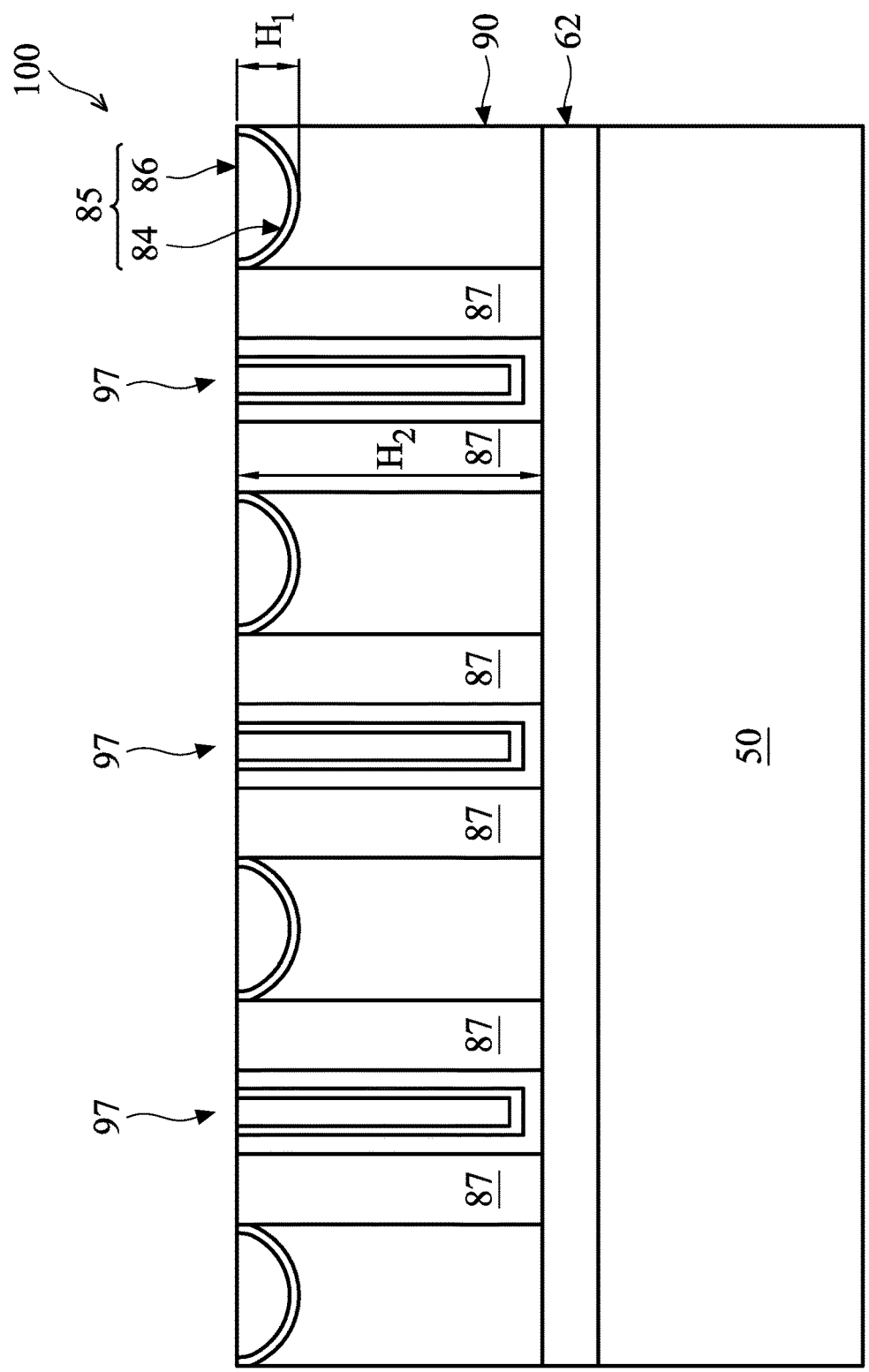
Figure 12B:
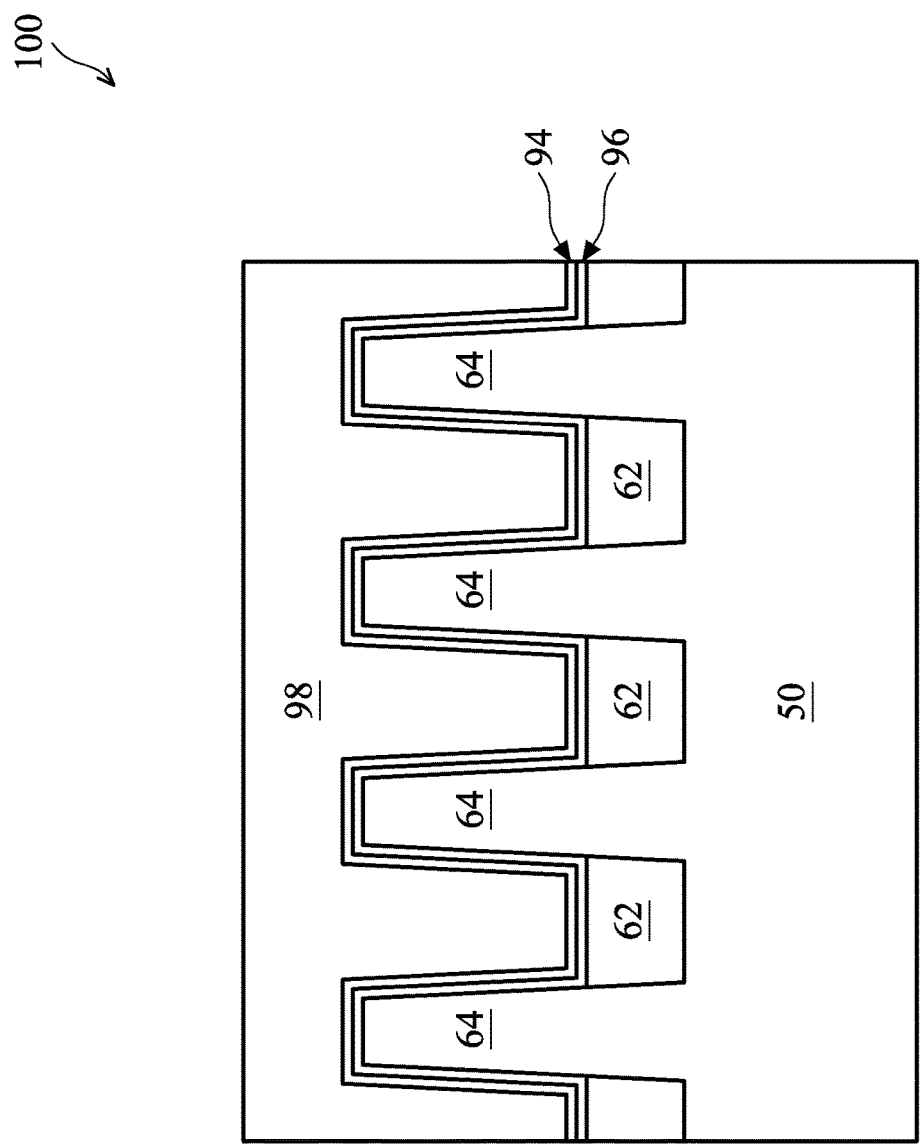

Next, in FIGS. 12A and 12B, a mask layer 85 (may also be referred to as a capping layer for the first ILD 90) is formed to fill the recesses 82. In the illustrated embodiment, the mask layer 85 has a bi-layered structure and comprises a first mask layer 84, which is conformal to the recesses 82, and a second mask layer 86 over the first mask layer 84. The mask layer 85 may be formed by conformally depositing the first mask layer 84 over the structure shown in FIG. 11A, then depositing the second mask layer 86 over the first mask layer 84 to fill the recesses 82. A planarization process, such as CMP, is performed next to remove excess portions of the first mask layer 84 and excess portions of the second mask layer 86, which excess portions are disposed over the upper surface of the metal gate 97 and over the upper surface of the gate spacers 87. After the planarization process, the upper surface of the metal gates 97 is exposed. In some embodiments, a thickness of the first mask layer 84 ranges from about 10 nm to about 60 nm, such as 30 nm. A height $H_1$ of the mask layer 85, measured between the upper surface of the second mask layer 86 and a lowest (e.g., closest to the substrate 50) surface of the first mask layer 84, is in a range from about 10 nm to about 100 nm, such as 50 nm, although other dimensions are also possible.

The first mask layer 84 may comprise a different material than the second mask layer 86 in some embodiments. In other embodiments, the first mask layer 84 and the second mask layer 86 comprise substantially a same material, but are formed by different deposition methods. For example, the first mask layer 84 may be a silicon nitride (SiN) layer formed by ALD, and the second mask layer 86 may be a silicon nitride layer formed by PECVD.

The densities of the same material (e.g., silicon nitride) formed by different deposition methods may be different, thus the physical properties (e.g., etch rate) of the same material formed by different deposition methods may also be different. For example, a silicon nitride layer formed by the ALD process may be denser and more resistant (e.g., having a slower etch rate) to a subsequent etching process than a silicon nitride layer formed by the PECVD process. One the other hand, the deposition rate of the PECVD process may be higher than that of the ALD process. Therefore, using a bi-layered structure for the mask layer 85 may shorten the total time needed to fill the recesses 82 by using the second mask layer 86 (e.g., silicon nitride formed by the PECVD process), while still having the benefit of a higher qualify (e.g., denser, slower etch rate) first mask layer 84 (e.g., silicon nitride formed by an ALD process).

In other embodiments, the mask layer 85 does not have the bi-layered structure described above. Instead, a single-layered structure (not shown) for the mask layer 85 is used, where a single material is formed by a suitable deposition process to fills the recesses 82 from the bottom to the top. In embodiments where a single-layered structure is used, the mask layer 85 comprises a material that contacts the first ILD 90 and extends continuously from the first ILD 90 to the upper surface of the metal gate 97. The mask layer 85, after being formed, may cover the upper surface of the metal gates 97, in which case a planarization process, such as CMP, may be performed to planarize the upper surface of the mask layer 85 and to expose the upper surface of the metal gates 97. The height $H_1$ of the mask layer 85, measured between the upper surface of the mask layer 85 and a lowest surface of the mask layer 85, is in a range from about 20 nm to about 40 nm, in some embodiments, although other dimensions are also possible.

The mask layer 85 may comprise any suitable material that has an etch rate that is lower than that of the metal gates 97. In some embodiments, an etch selectivity (e.g., a ratio of the etch rates) between the metal gate 97 and the mask layer 85 is over a pre-determined threshold, which per-determined threshold may be determined by factors such as the height $H_1$ of the mask layer 85 and the height $H_2$ of the metal gate 97. For example, an etch selectivity between the metal gate 97 and the mask layer 85, or a ratio of the etch rate of the metal gate 97 to the etch rate of the mask layer 85, may be equal to or larger than a ratio of the height $H_2$ to the height $H_1$. In some embodiments, the height $H_2$ of the metal gate 97 is in a range from about 60 nm to about 200 nm, such as 150 nm. In some embodiments, the pre-determined threshold is about 2. In other embodiments, the pre-determined threshold is about 10, or even about 100. Note that since the mask layer 85 may have more than one layers (e.g., 84/86), and the metal gates 97 may have more than one layers (e.g., 94/96/98) of materials, the etch rate in the discussion herein may refer to the overall etch rate (e.g., average etch rate) of the corresponding structure (e.g., metal gates 97 or mask layer 85).

In accordance with an embodiment, the mask layer 85 comprises a suitable dielectric material such as silicon nitride or carbon (e.g., carbon compound). For example, the mask layer 85 may be an ashable hard mask (AHM) comprising carbon formed at a temperature of about 350° C. The AHM may comprise $C_xH_y$, as an example. An etch selectivity between the metal gate 97 and the AHM carbon may be about 2.2.

As another example, the mask layer 85 may comprise silicon nitride formed by ALD or PECVD. An etch selectivity between the metal gate 97 and silicon nitride formed by PECVD may be about 2.4. Since the density of silicon nitride formed by ALD may be higher than that of silicon nitride formed by PECVD, an etch selectivity between the metal gate 97 and silicon nitride formed by ALD may be about 2.6.

In some embodiments, the mask layer 85 comprises a suitable metal such as cobalt (Co), which may be formed by PVD, CVD, ALD, or the like. An etch selectivity between the metal gate 97 and cobalt may be between 4 and 5.

In some embodiments, the mask layer 85 comprises a suitable metal oxide such as LaO or $Y_2O_3$, which may be formed by PVD, CVD, ALD, or the like. For example, a lower temperature (e.g., about 300° C.) ALD deposition process may be used to form the mask layer 85 comprising the metal oxide. An etch selectivity between the metal gate 97 and LaO may be about 13.2. An etch selectivity between the metal gate 97 and $Y_2O_3$ may be about 100 or larger.

In some embodiments, the metal oxide used for the mask layer 85 comprises LaSiO, and the atomic percentage (at %) of Si in LaSiO may be adjusted in order to adjust the etch selectivity between the metal gate 97 and LaSiO. For example, with 33 at % and 66 at % of Si, the etch selectivity between the metal gate 97 and LaSiO is about 9.3 and about 6.1, respectively.

In an embodiment, the composition of the mask layer 85 (e.g., LaSiO) is adjusted to accommodate a target dimension (e.g., height $H_2$ of the metal gates 97 and the height $H_1$ of the mask layer 85) of the FinFET device 100. For example, by varying the atomic percentage of Si in LaSiO, or by changing the materials(s) used to form the mask layer 85, the etch selectivity between the metal gate 97 and the mask layer 85 can be adjusted to be equal to or larger than the ratio of $H_2/H_1$. The ratio of $H_2/H_1$ may range from about 2 to about 100, or even larger. For example, the ratio of $H_2/H_1$ may be about 2, about 10, or about 100.

Figure 13A:
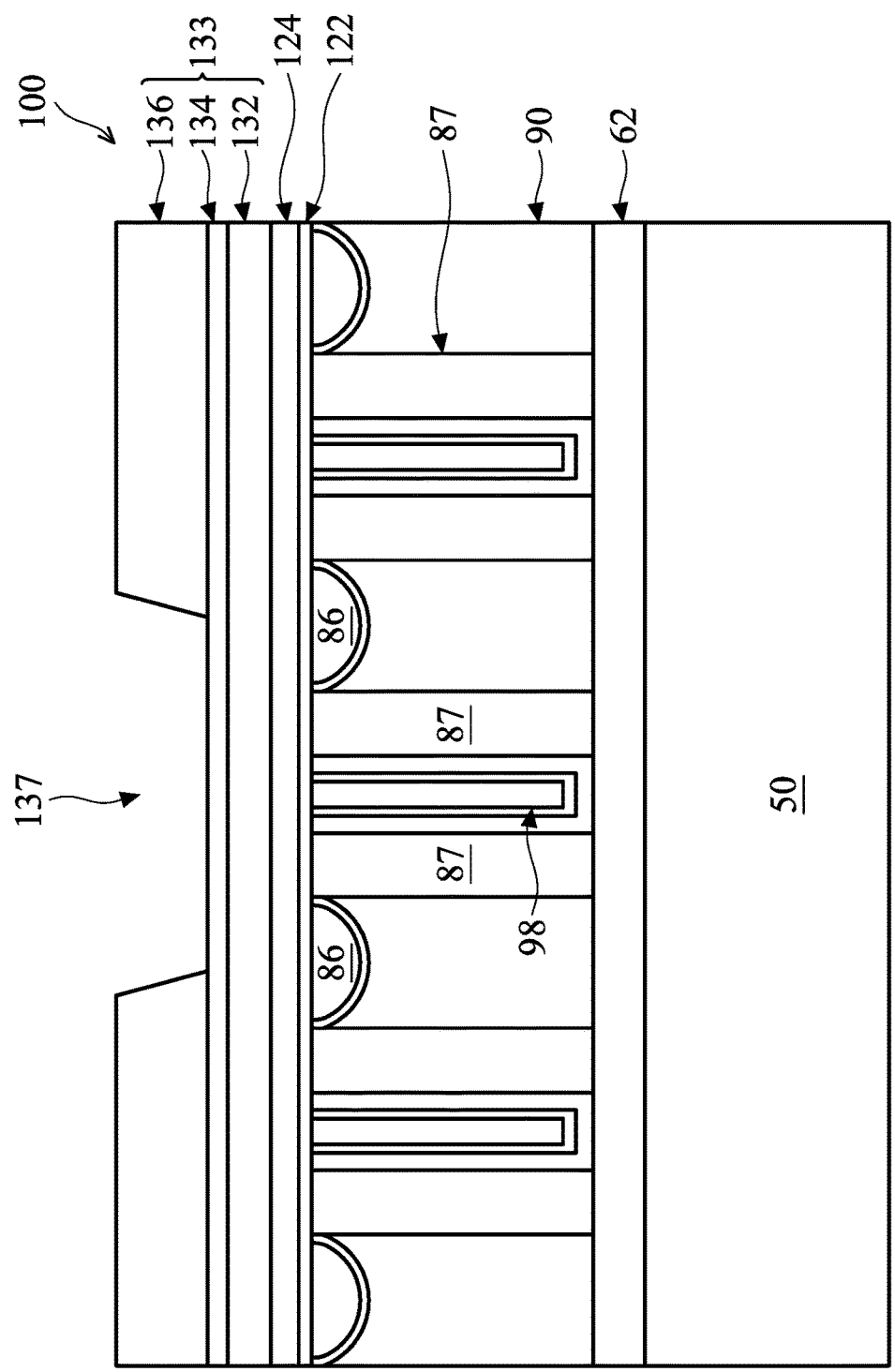
Figure 13B:
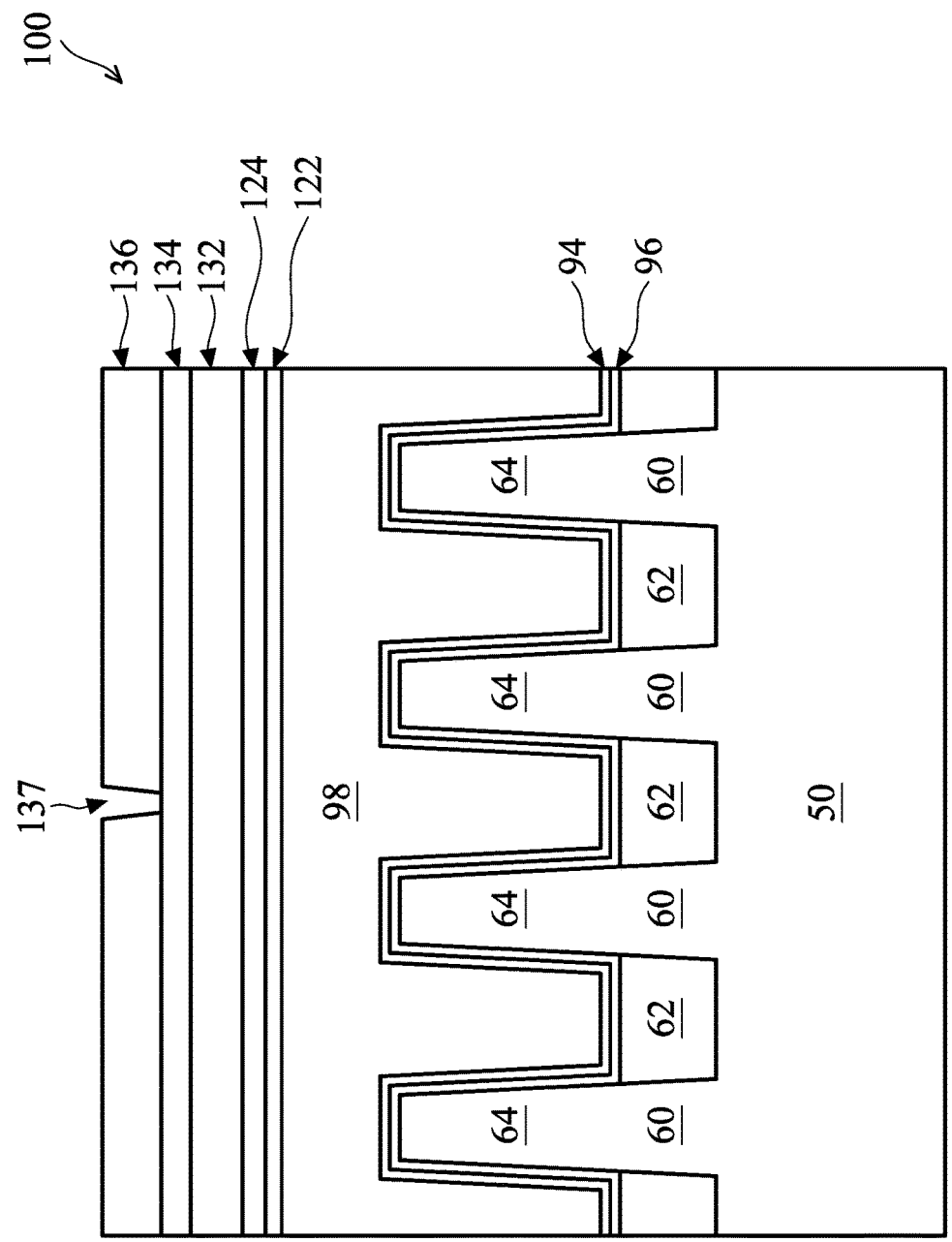

Next, in FIG. 13A and FIG. 13B, a first hard mask layer 122 and a second hard mask layer 124 are formed consecutively over the FinFET device 100. Subsequently, a photoresist (PR), such as a tri-layered photoresist 133 comprising a top photoresist layer 136, a middle layer 134, and a bottom anti-reflective coating (BARC) layer 132, are formed over the second hard mask layer 124.

In some embodiments, the first hard mask layer 122 is a metal hard mask layer and the second hard mask layer 124 is a dielectric hard mask layer. In subsequent processing steps, a pattern is transferred onto the first hard mask layer 122 using various photolithography and etching techniques. The first hard mask layer 122 may then be used as a patterning mask for etching the underlying structure (e.g., metal gates 97). The first hard mask layer 122 may be a masking material such as titanium nitride, titanium oxide, the like, or a combination thereof. The first hard mask layer 122 may be formed using a process such as ALD, CVD, PVD, the like, or a combination thereof.

The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, tetraethyl orthosilicate (TEOS), SiOxCy, the like, or a combination thereof. The second hard mask layer 124 may be formed using a process such as CVD, ALD, the like, or a combination thereof. In an exemplary embodiment, the first hard mask layer 122 comprises titanium nitride, and the second hard mask layer 124 comprises silicon nitride.

As illustrated in FIG. 13A and FIG. 13B, the tri-layer photoresist 133 is formed over the second hard mask layer 124. The BARC layer 132 of the tri-layered photoresist 133 may comprise an organic or inorganic material. The middle layer 134 may comprise silicon nitride, silicon oxynitride, or the like, that has an etch selectivity to the top photoresist layer 136, such that the top photoresist layer 136 can be used as a mask layer to pattern the middle layer 134. The top photoresist layer 136 may comprise a photosensitive material. Any suitable deposition method, such as PVD, CVD, spin coating, the like, or combinations thereof, may be used to form the tri-layered photoresist 133.

Once the tri-layered photoresist 133 is formed, a pattern 137 (e.g., an opening) is formed in the top photoresist layer 136. In an embodiment the top photoresist layer 136 may be patterned by exposing the photosensitive material within the top photoresist layer 136 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist layer 136 are different from the physical properties of the unexposed portions of the top photoresist layer 136. The top photoresist layer 136 may then be developed with, e.g., a developer (not separately illustrated), in order to separate the exposed portion of the top photoresist layer 136 from the unexposed portion of the top photoresist layer 136.

Figure 14A:
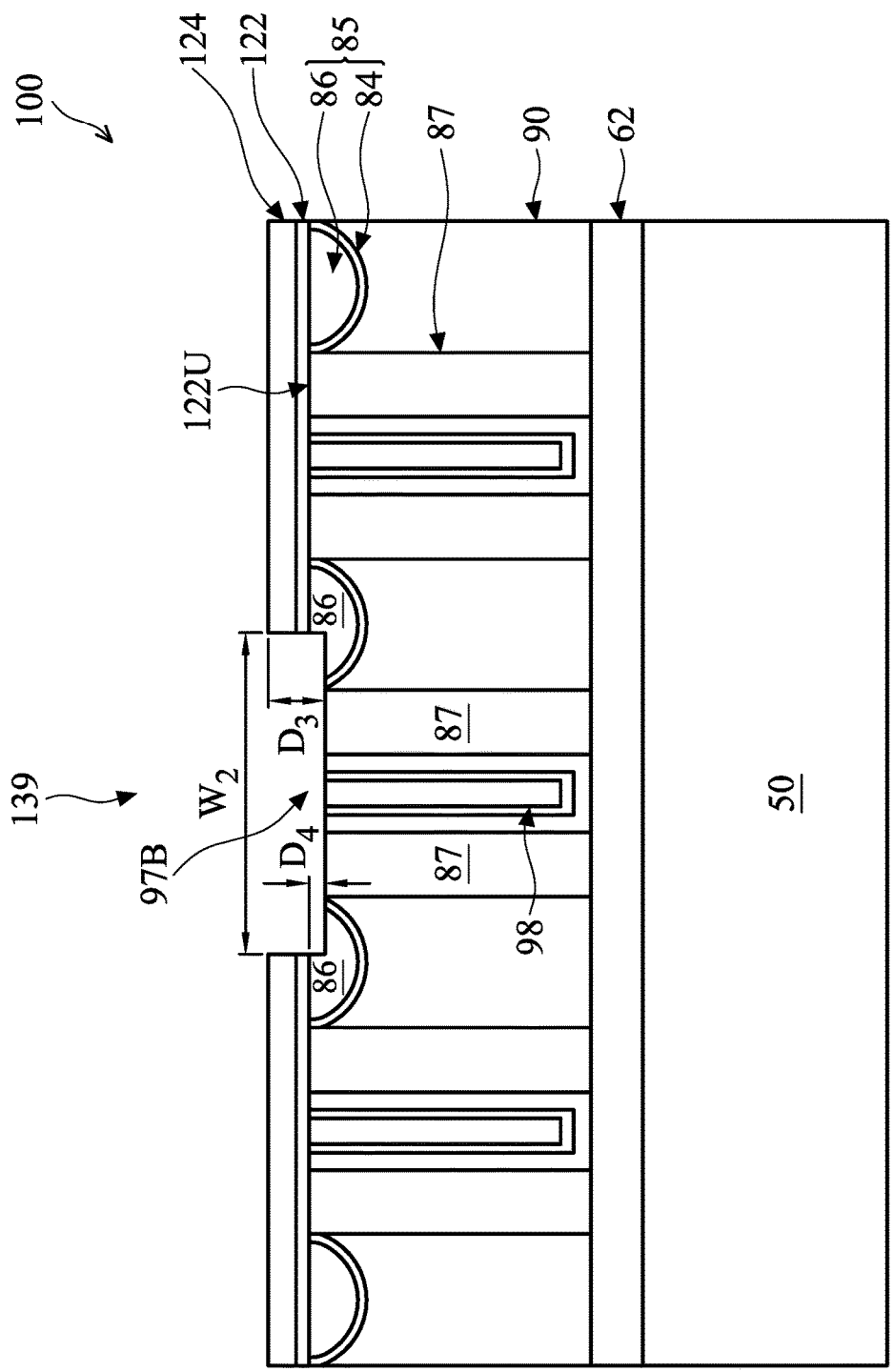
Figure 14B:
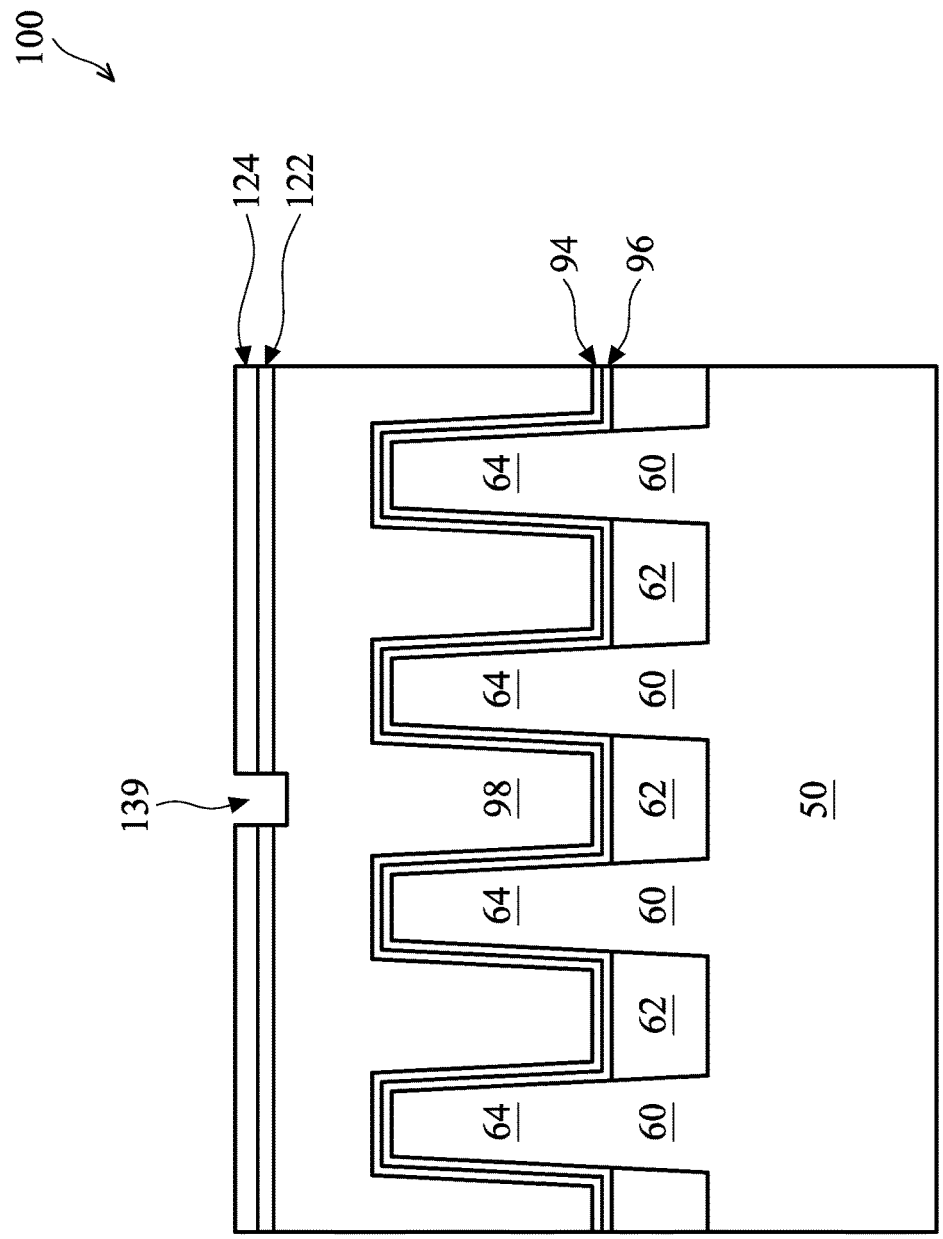

Next, as illustrated in FIG. 14A and FIG. 14B, the pattern 137 in the top photoresist layer 136 is extended through the middle layer 134 and the BARC layer 132, and is transferred to the first hard mask layer 122 and the second hard mask layer 124 using suitable methods, such as one or more anisotropic etching processes. As a result, a pattern 139 (e.g., an opening) is formed in the first hard mask layer 122 and the second hard mask layer 124. The pattern 139 exposes the metal gate 97B, e.g., the portion of the metal gate 97B within the cut area 55 (see FIG. 9). As illustrated in FIG. 14A, the pattern 139 also exposes the gate spacers 87 around the metal gate 97B, and portions of the mask layer 85 around the metal gate 97B. In some embodiments, the etching process used to form the pattern 139 also recesses top portions of the metal gate 97B, top portions of the gate spacers 87 exposed by the pattern 139, and top portions of the mask layer 85 exposed by the pattern 139 below a lower surface 122U of the first hard mask layer 122.

In some embodiments, a width W2 of the pattern 139 is in a range from about 20 nm to about 80 nm, such as 50 nm. A depth D3 of the pattern 139, measured between an upper surface of the second hard mask layer 124 and a recessed top surface of the mask layer 85, may range from about 20 nm to about 100 nm, such as 60 nm. An offset D4 between the lower surface 122U of the first hard mask layer 122 and the recessed top surface of the mask layer 85 is between about 5 nm and about 40 nm, such as 20 nm. However, any suitable dimensions may be utilized.

Figure 15A:
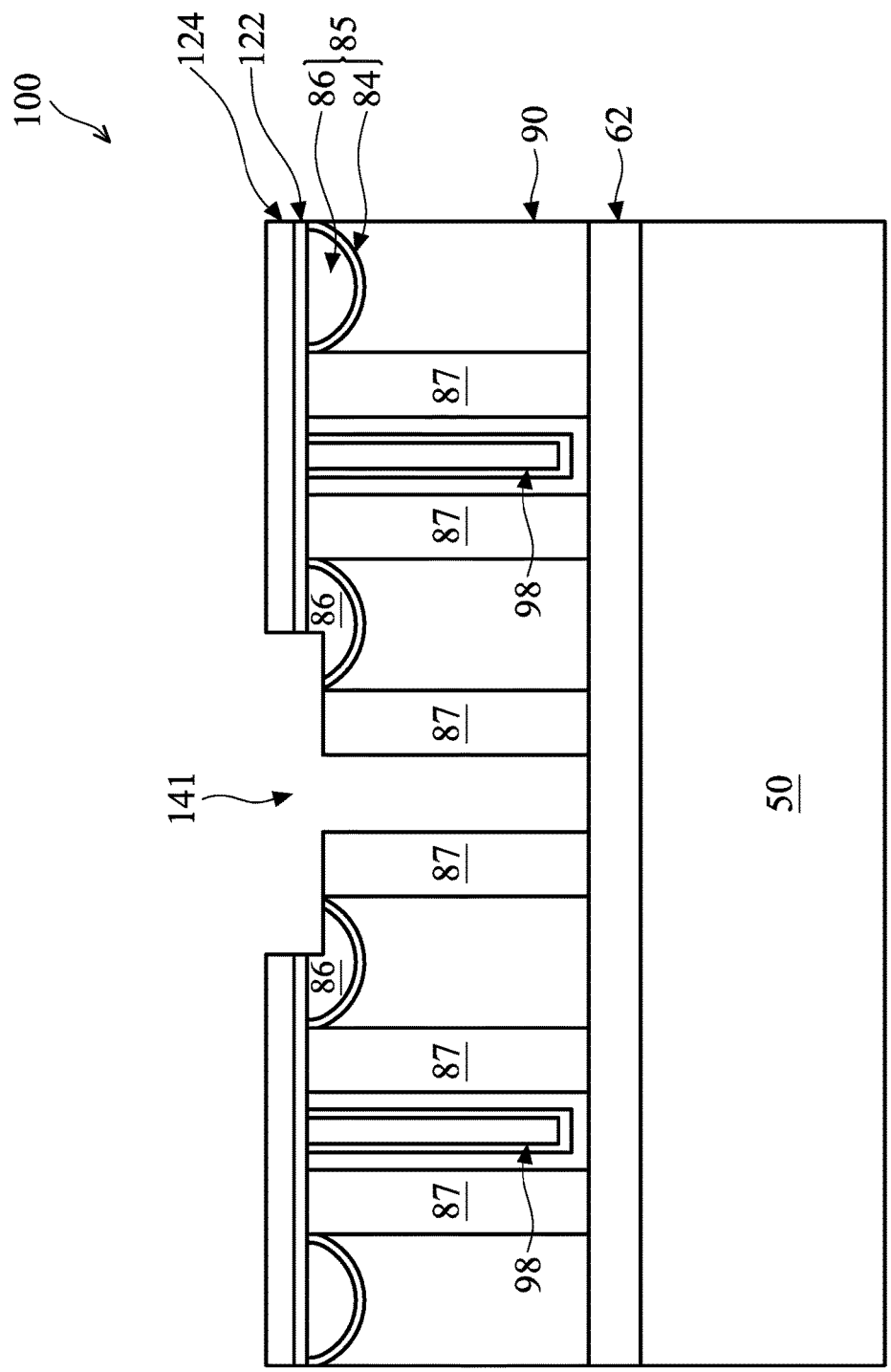
Figure 15B:
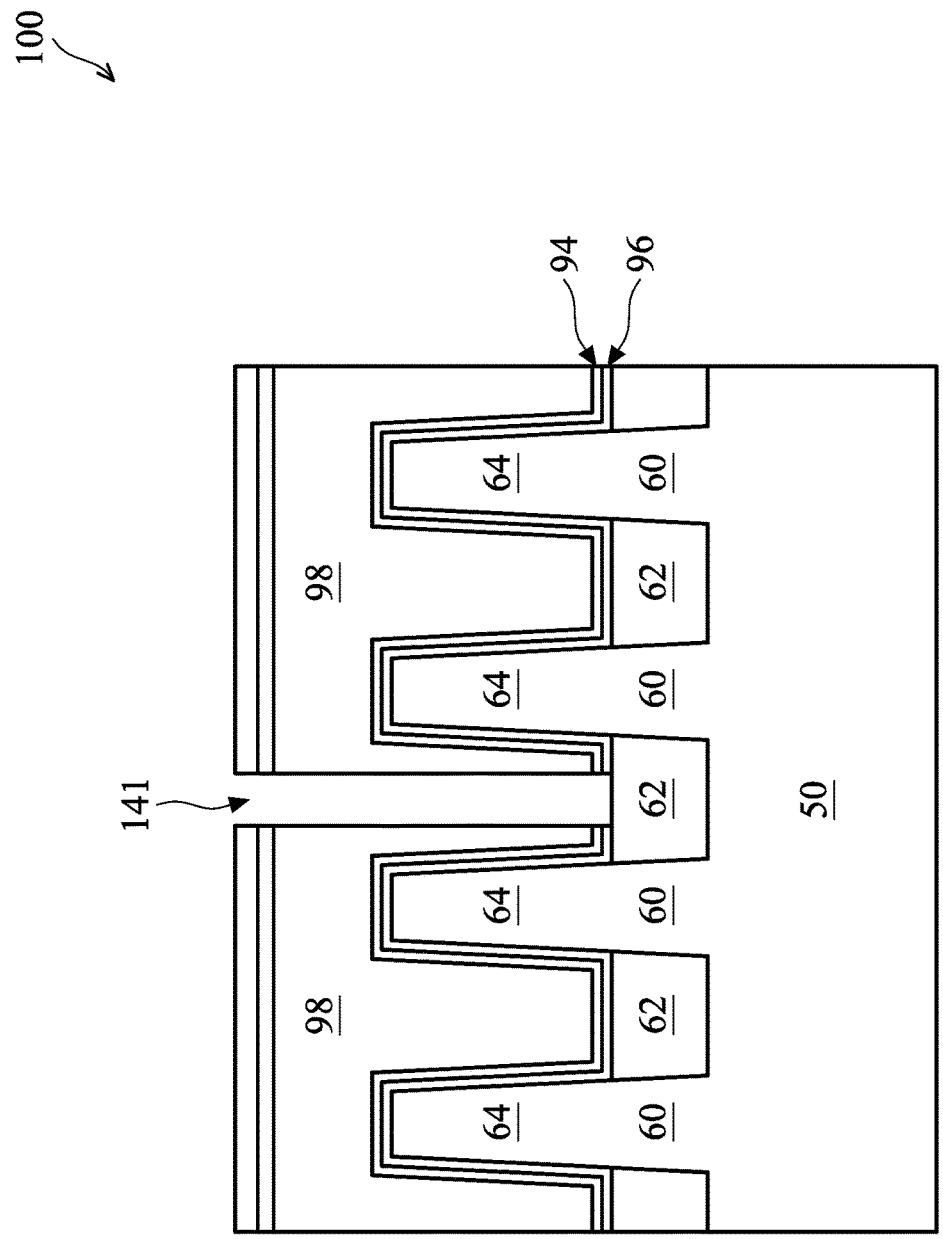

Next, as illustrated in FIG. 15A and FIG. 15B, portions of the metal gate 97B within the cut area 55 (see FIG. 9) and exposed by the pattern 139 (see FIG. 14A) are removed. A width W3 of the cut area 55 may range from about 10 nm to about 40 nm, such as 20 nm, and a length L1 of the cut area 55 may range from about 10 nm to about 60 nm, such as 30 nm, although the dimensions of the cut area 55 may comprise other values. A suitable etching process, such as an anisotropic etching process, may be performed to remove the exposed portions of the metal gate 97B. After the portions of the metal gate 97B within the cut area 55 are removed, a recess 141 (e.g., an opening) is formed at the location where the removed portions of the metal gate 97B used to be.

Since the first ILD 90 is covered by the mask layer 85, the loss of the first ILD 90 during the etching process is reduced. In some embodiments, top portions of the mask layer 85 is removed during the etching process to form the recess 141, and bottom portions of the mask layer 85 remain over the first ILD 90, thus shielding the first ILD 90 from the etching process. In some embodiments, depending on factors such as the height H1 of the mask layer 85 and the duration of the etching process to form the recess 141, the mask layer 85 may be removed by the etching process, thus exposing the underlying first ILD 90. As a result, top portions of the first ILD 90 may be etched away by the etching process, but at a reduced amount compared with a fabrication method without the mask layer 85. For example, without the mask layer 85, more than 70 nm of the first ILD 90, measured along the direction of $H_2$ in FIG. 12A, may be lost during the etching process. With the protection of the mask layer 85, less than 28 nm of the first ILD 90 is lost. Excessive loss of the first ILD 90 during the etching process may cause damage to the epitaxial source/drain regions 80. Therefore, the present disclosure also reduces or prevents the damage of the epitaxial source/drain regions 80 during the metal gate cutting process.

Figure 16A:
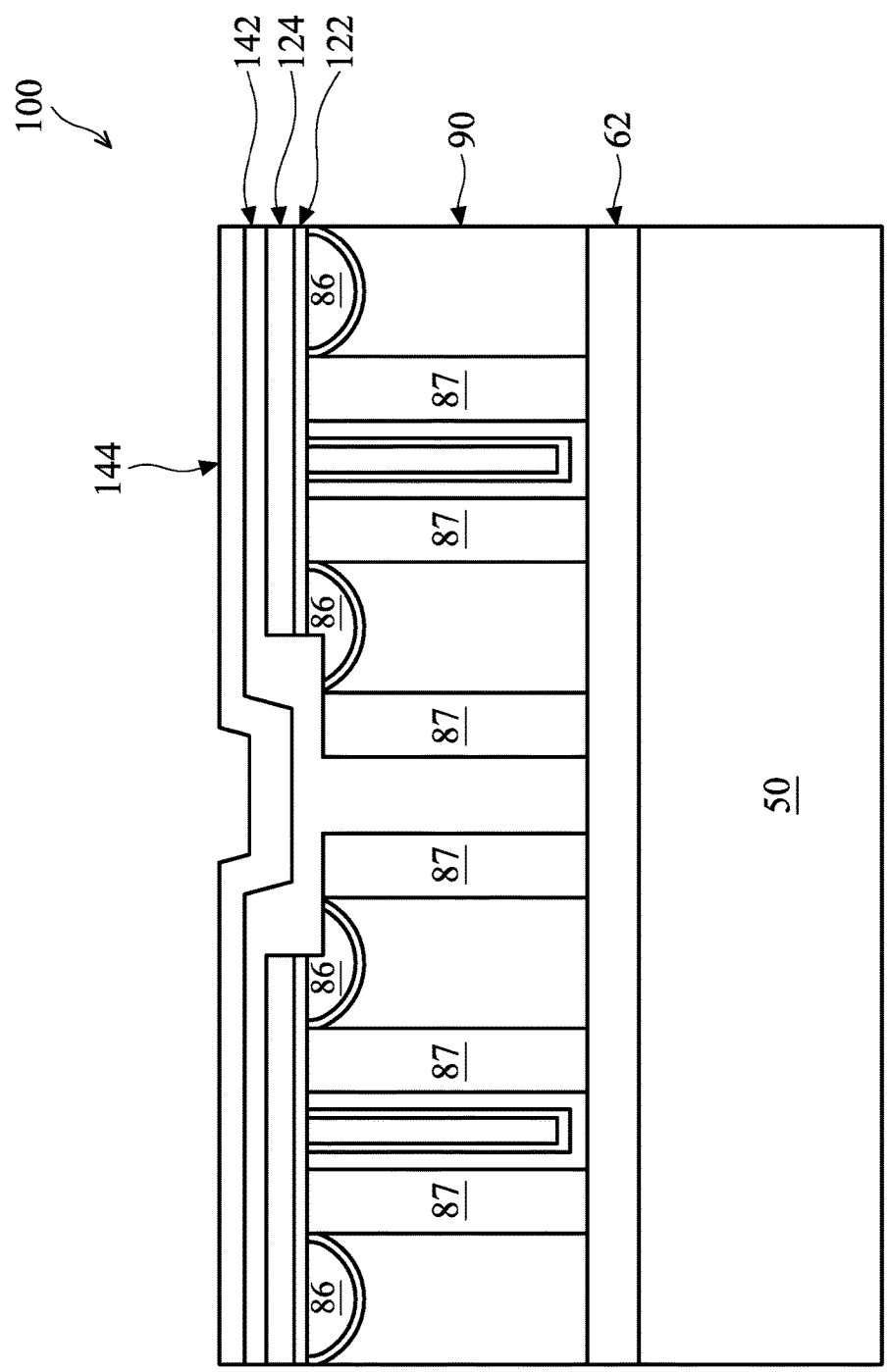
Figure 17A:
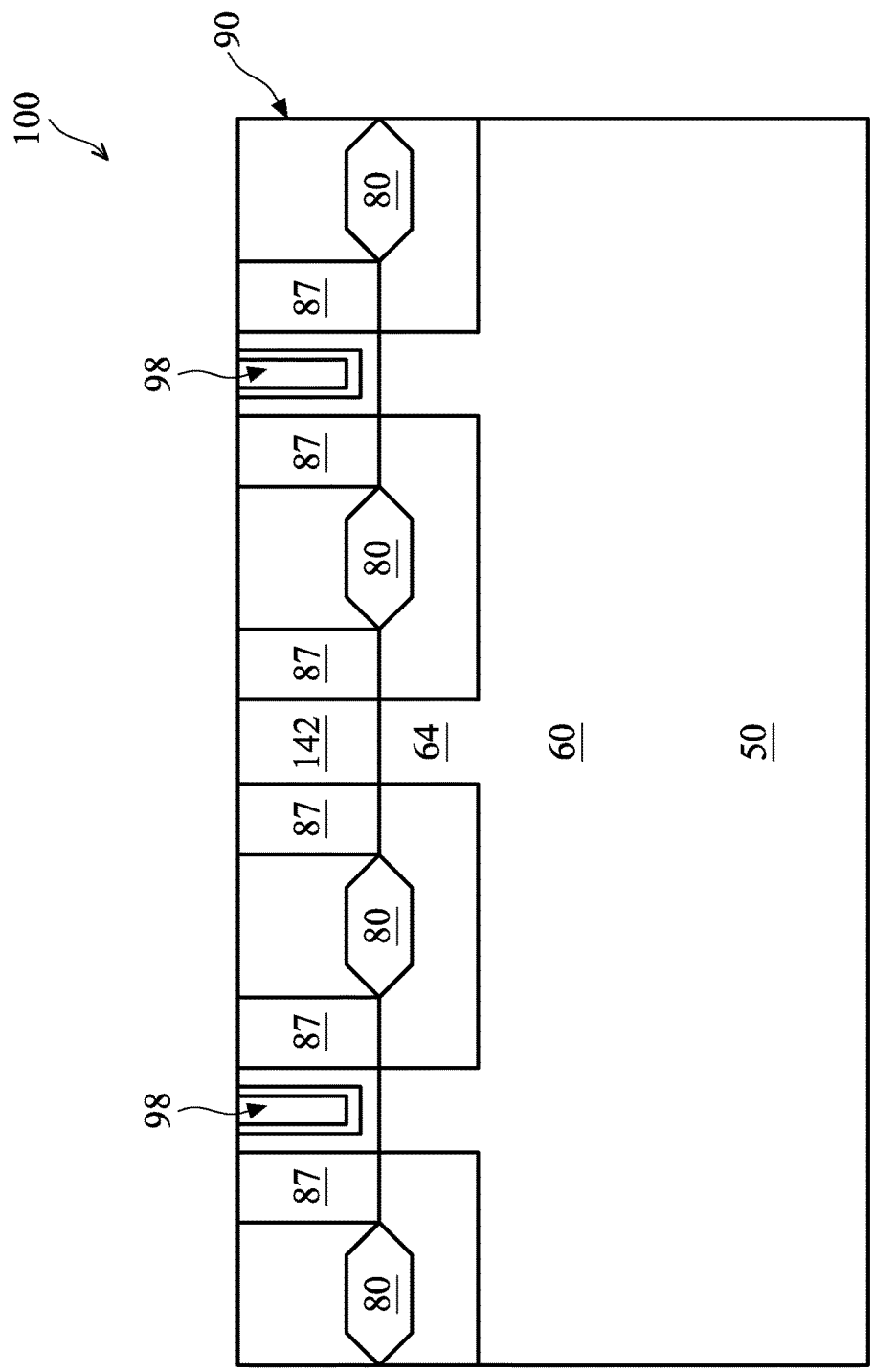

Next, as illustrated in FIG. 16A and FIG. 16B, the recess 141 is filled by a dielectric material. In the illustrated example, the recess 141 is filled by a first dielectric layer 142 and a second dielectric layer 144, which may or may not comprise a same dielectric material. Suitable materials for the first dielectric layer 142 and the second dielectric layer 144 may include silicon nitride, silicon oxynitride, silicon carbide, and the like, formed by PVD, CVD, ALD, or other suitable deposition method.

In some embodiments, the first dielectric layer 142 and the second dielectric layer 144 comprise a same material formed by different deposition methods. For example, the first dielectric layer 142 comprises silicon nitride formed by an ALD process, and the second dielectric layer 144 comprises silicon nitride formed by a PECVD process. Since a material (e.g., silicon nitride) formed by the ALD process may have a higher density than the material formed by the PECVD process, silicon nitride formed by the ALD process may have different physical properties (e.g., harder, slower etch rate) than silicon nitride formed by the PECVD process. On the other hand, PECVD process may have a higher deposition rate than the ALD process, thus may deposit materials faster than the ALD process. By using both the ALD process and the PECVD process in filling the recess 141, a higher quality first dielectric layer 142 is formed to insulate the metal gates (e.g., 97B_1 and 97B_2 in FIG. 17B) formed by the metal gate cutting process, and the second dielectric layer 144 is formed quickly to fill the recess 141, thus shortening the processing time.

Figure 17B:
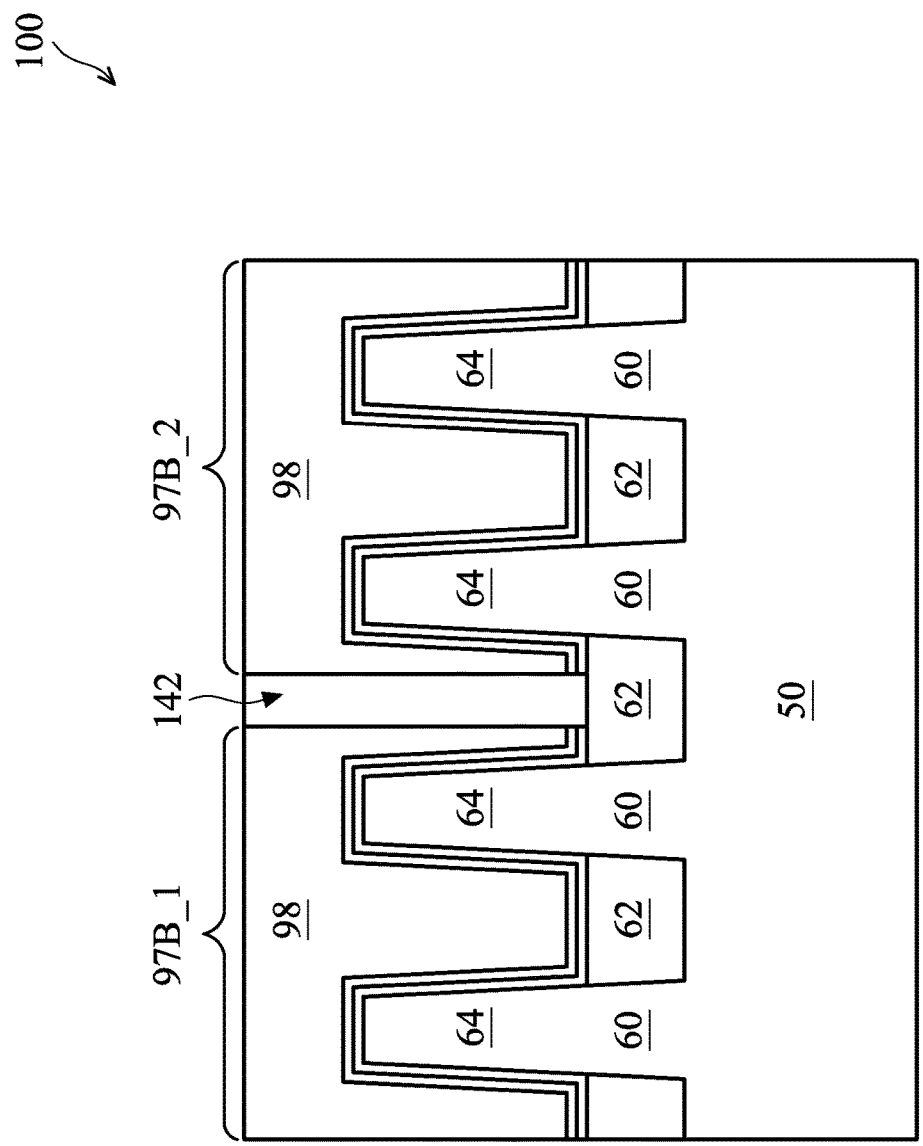
Figure 18A:
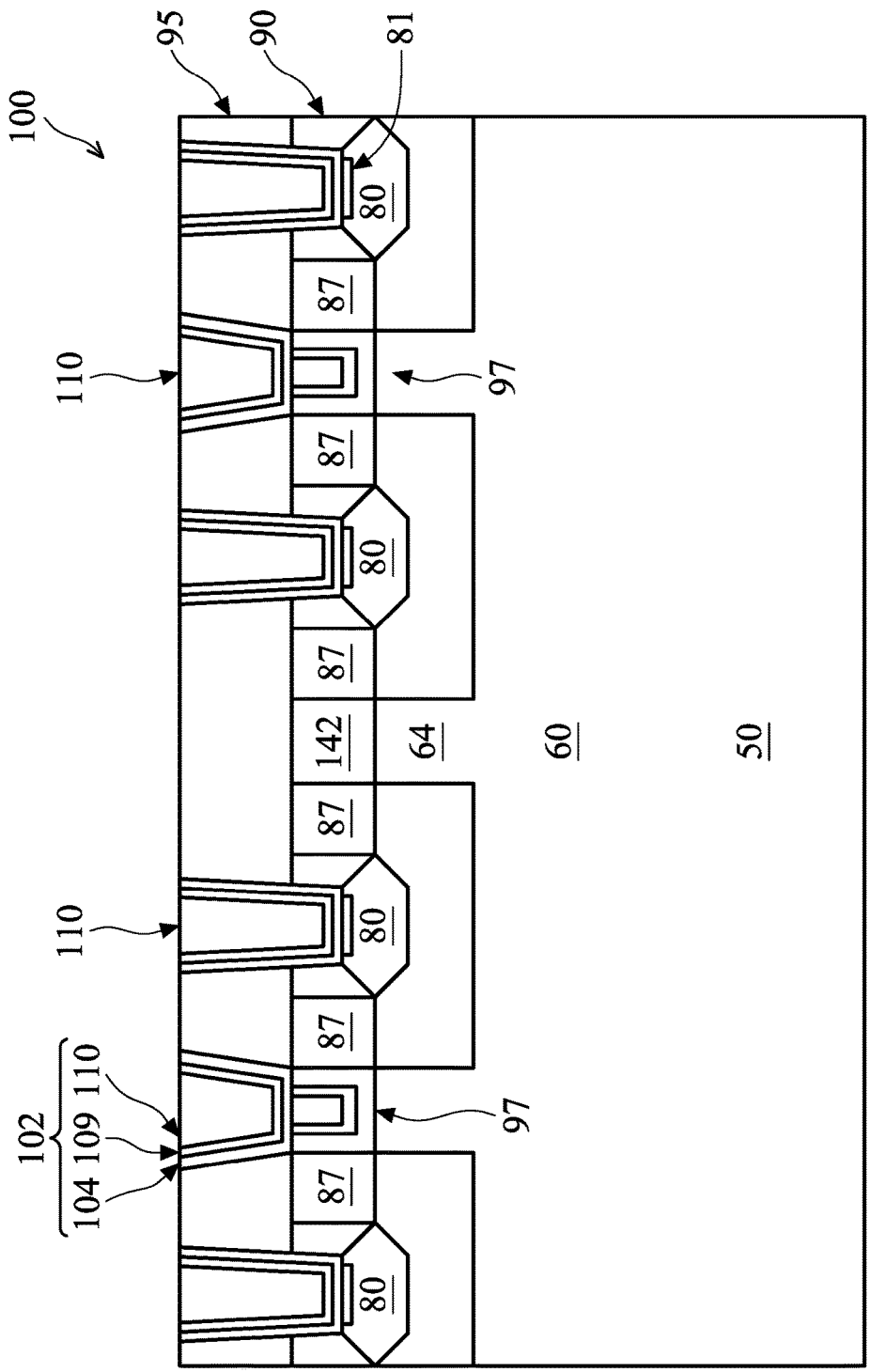

Next, as illustrated in FIGS. 17A and 17B, a planarization process, such as a CMP process, is performed to remove the first hard mask layer 122, the second hard mask layer 124, and portions of the first dielectric layer 142/second dielectric layer 144 over the upper surface of the second hard mask layer 124. In some embodiment, the planarization process continues until the mask layer 85 over the first ILD 90 is removed, as illustrated in FIG. 17A. Note that the cross-sectional view of FIG. 17A is along cross-section A-A.

Figure 18B:
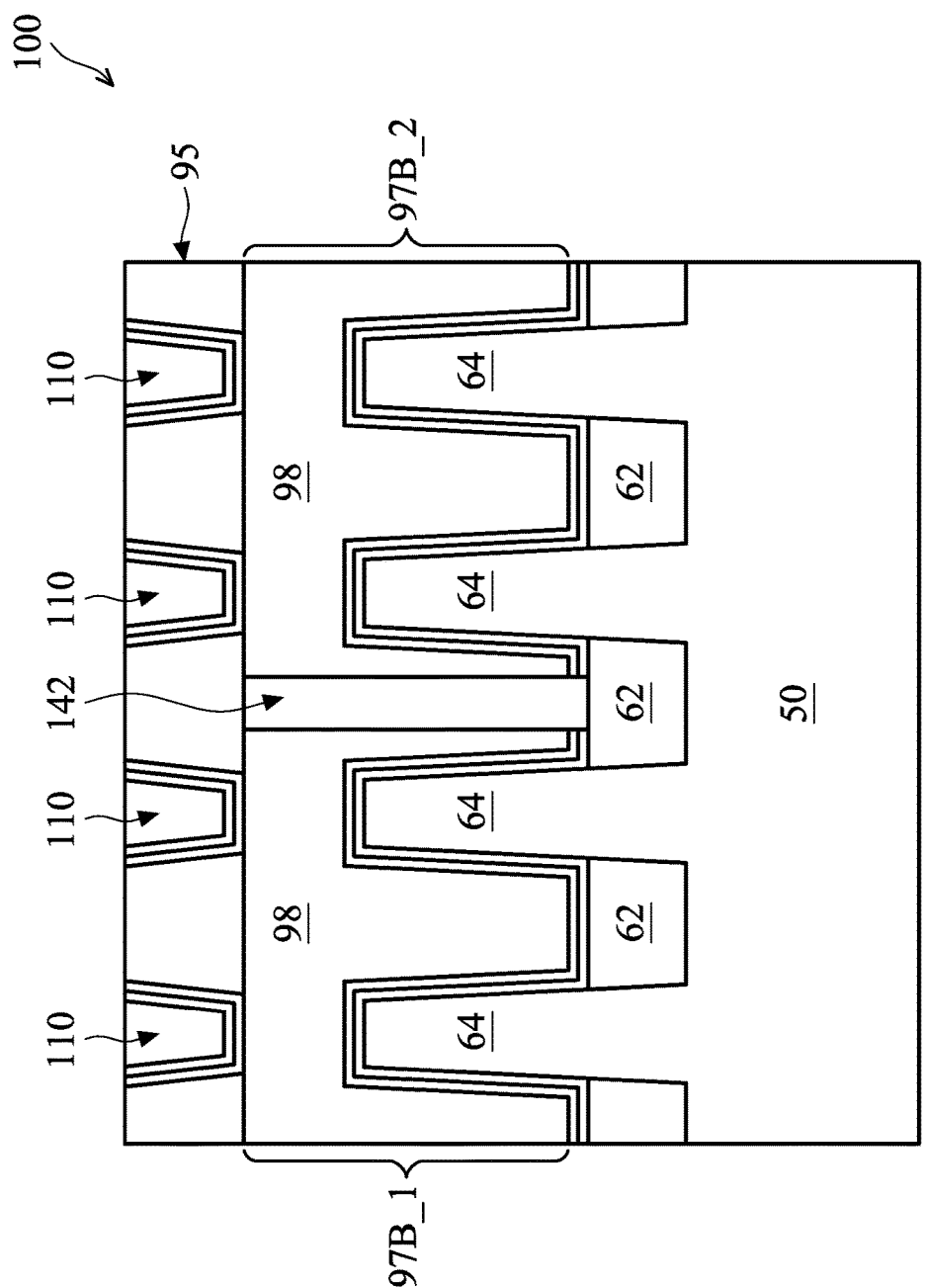

Next, as illustrated in FIGS. 18A and 18B, contacts 102 are formed over and electrically connected to the metal gates 97. To form the contacts 102, a second ILD 95 is formed over the first ILD 90. In some embodiments, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Next, contact openings are formed through the first ILD 90 and/or the second ILD 95 to expose the source/drain regions 80 and the metal gates 97, which contact openings are then filled with electrically conductive material(s) to form the contacts 102. In some embodiments, silicide regions 81 are formed over the source/drain regions 80 before the contact openings are filled. Details of forming the contacts 102 are discussed hereinafter.

In some embodiments, silicide regions 81 are formed over the source/drain regions 80. Silicide regions 81 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 81. The unreacted portions of the deposited metal are then removed, e.g., by an etching process. Although regions 81 are referred to as silicide regions, regions 81 may also be germanide regions, or silicon germanide regions (e.g., regions comprising silicide and germanide).

Next, a barrier layer 104 is formed lining sidewalls and bottoms of the contact openings, over the silicide regions 81, and over the upper surface of the second ILD 95. The barrier layer 104 may comprise titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed onto the seed layer 108, filling and overfilling the contact openings. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess barrier layer 104, seed layer 109, and conductive material 110 outside of the contact openings may be removed through a planarization process such as CMP, although any suitable removal process may be used. Contacts 102 are thus formed in the contact openings. The contacts 102 are illustrated in a single cross-section as an example, the contacts 102 could be in different cross-sections. In addition, in FIG. 18B, two contacts 102 are shown connected to each of the two metal gate 97B_1 and 97B_2 as examples. The number and the location of the contacts 102 connected to each of the metal gates 97B_1 and 97B_2 may be changed without departing from the spirit of the present disclosure, these and other modifications are fully intended to be included within the scope of the present disclosure.

FIGS. 19-24 illustrate cross-sectional views of the FinFET device 100 along cross-section C-C at various stages of processing, in accordance with another embodiment. For example, FIGS. 2-11B, 19-24, and 17A-18B illustrate processing steps to form a FinFET device 100 in another embodiment.

Figure 19:
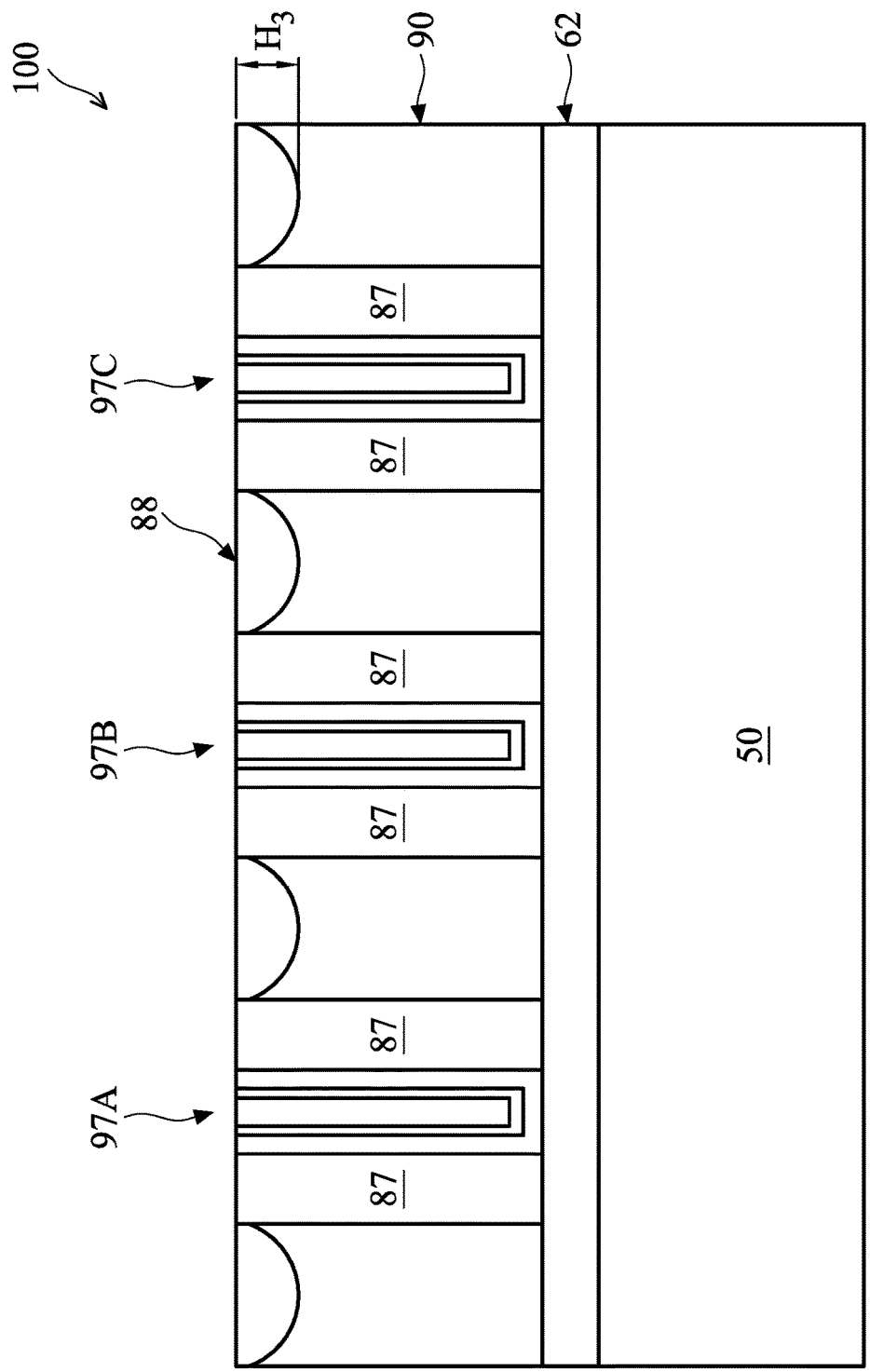
FIGS. 19-24 illustrate cross-sectional views of a FinFET device at various stages of fabrication, in accordance with an embodiment.

Referring to FIG. 19, the recesses 82 in FIG. 11A are filled with a silicon layer 88, which may be formed by PVD, CVD, or other suitable deposition method. A planarization process, such as CMP, may be performed to planarize the deposited silicon until the upper surface of the metal gates 97 is exposed. A depth $H_3$ of the silicon layer 88 may be in a range from about 20 nm to about 40 nm.

Figure 20:
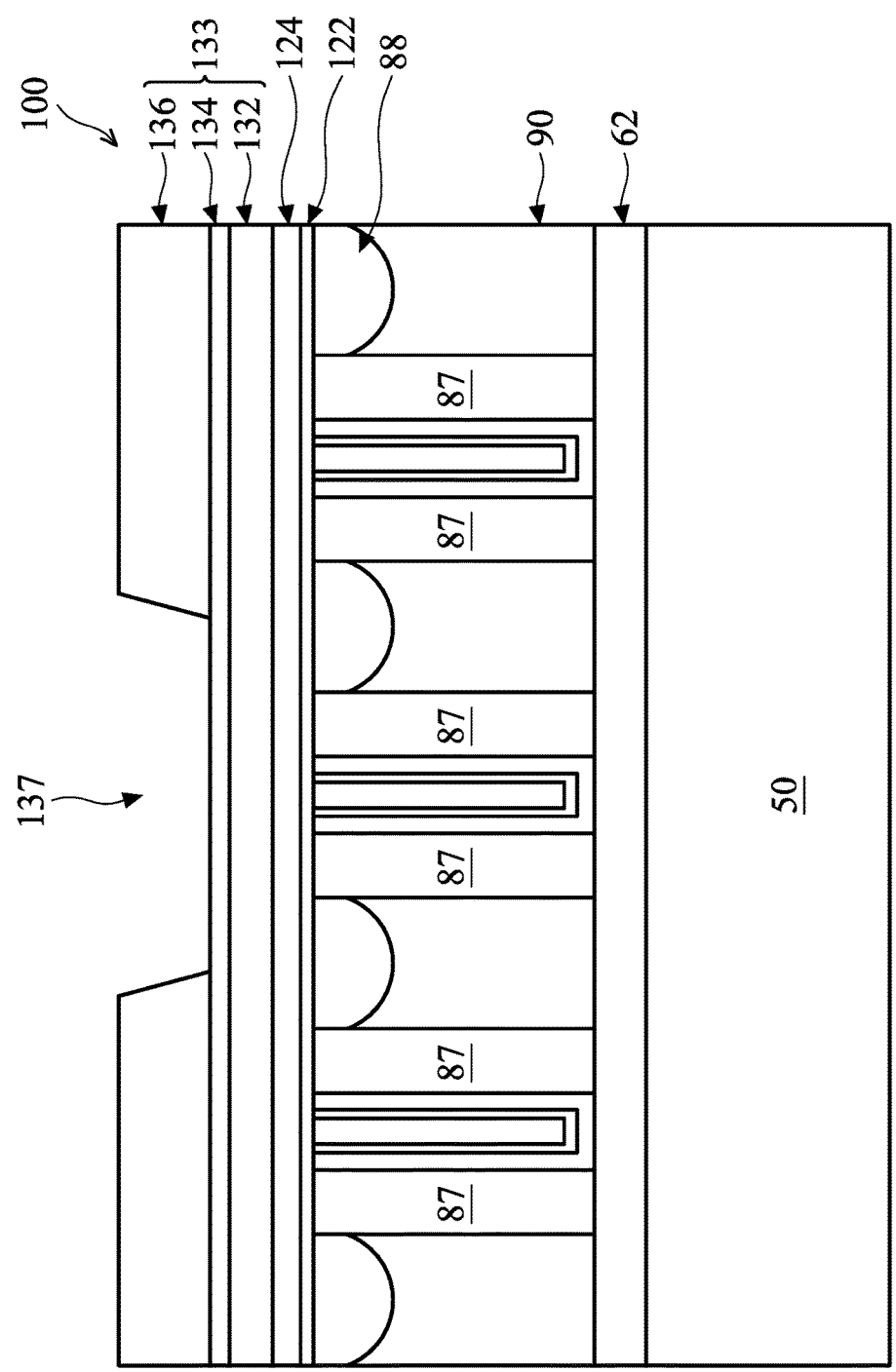

Next, in FIG. 20, the first hard mask layer 122, the second hard mask layer 124, and the tri-layered photoresist 133, which comprises the top photoresist layer 136, the middle layer 134, and the BARC layer 132, are formed consecutively over the structure shown in FIG. 19. The materials and the formation methods of the first hard mask layer 122, the second hard mask layer 124, and the tri-layered photoresist 133 are similar to those in FIG. 13A, details are not repeated here. As illustrated in FIG. 20, the pattern 137 (e.g., an opening) is formed in the top photoresist layer 136 by a photolithography process.

Figure 21:
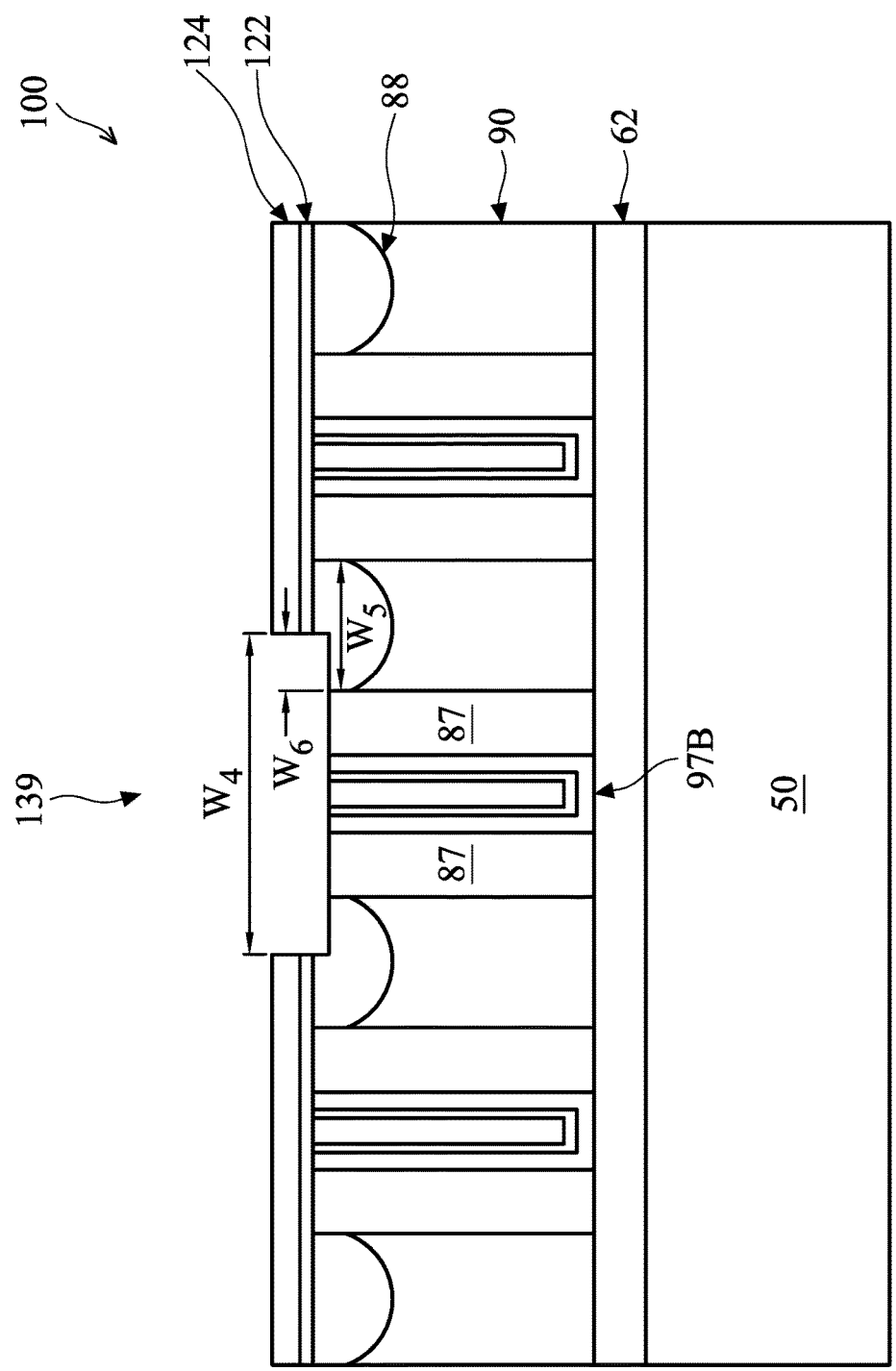

Next, as illustrated in FIG. 21, the pattern 137 is transferred to the first hard mask layer 122 and the second hard mask layer 124. The pattern 139 (e.g., an opening) is formed exposing the metal gate 97B, the gate spacers 87 on sidewalls of the metal gate 97B, and portions of the silicon layer 88 adjacent the metal gate 97B. In some embodiments, a width W4 of the pattern 139 is between about 20 nm and about 60 nm, such as 40 nm. A width W5 of the silicon layer 88 is between about 10 nm and about 50 nm, such as 30 nm, and a width W6 of the exposed portion of the silicon layer 88 is about 5 nm and about 30 nm, such as 15 nm, in some embodiments. In accordance with an embodiment, a ratio between the width W6 and the width W5 is between about 1 and about 3, such as 2.

Figure 22:
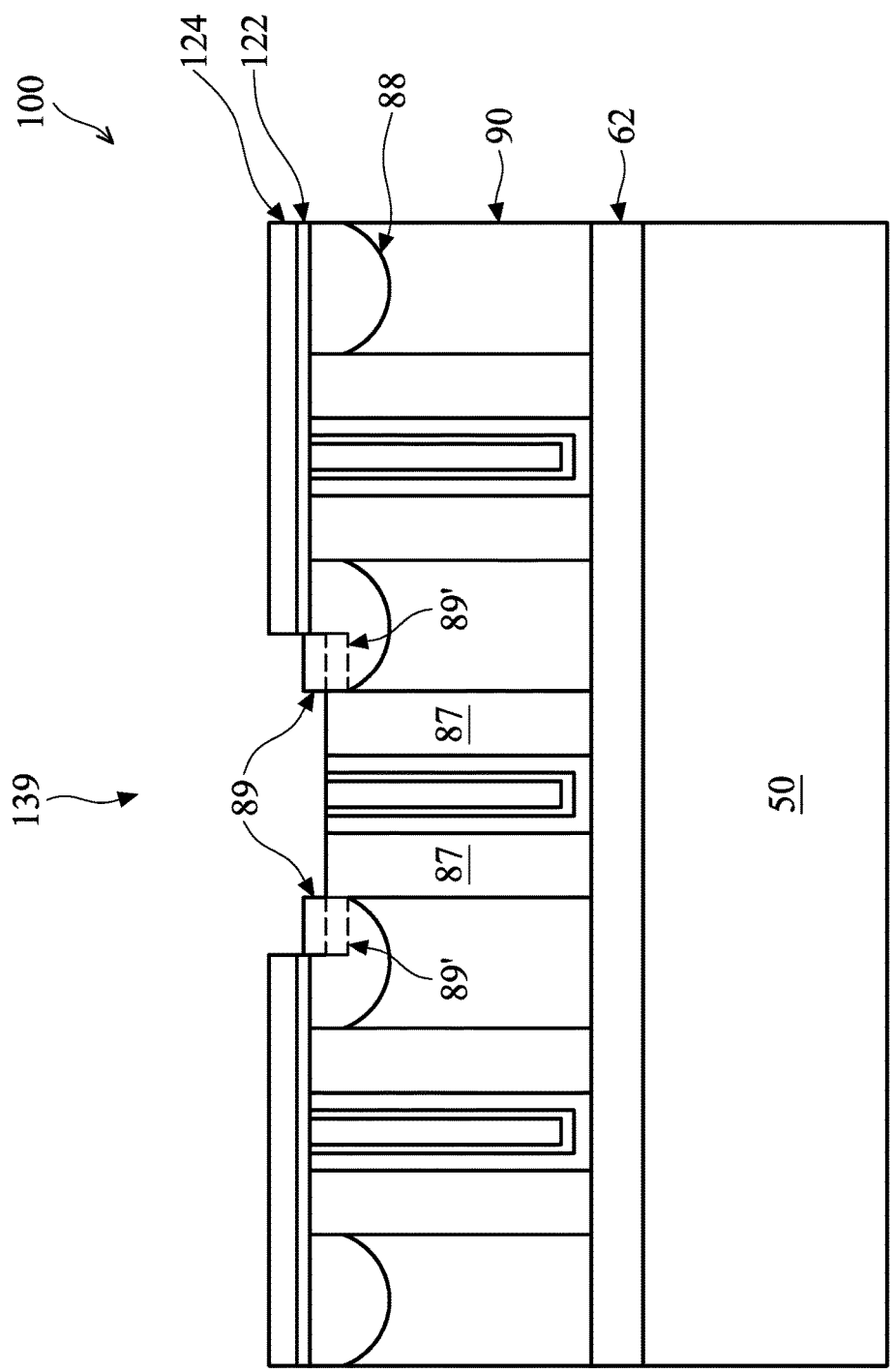

Next, in FIG. 22, a mask layer 89 is selectively formed over the exposed portion (e.g., exposed by the pattern 139) of the silicon layer 88. In some embodiments, the mask layer 89 comprises silicon nitride formed by a selective deposition method, such as ALD, although other suitable selective deposition method may also be used. Note that since the mask layer 89 is selectively formed over the exposed portion of the silicon layer 88, a width of the mask layer 89, measured along the direction of W6, is the same as the width W6.

In another embodiment, a mask layer 89' (shown in phantom) is selectively formed in the top portion of the silicon layer 88. The silicon layer 88 may be exposed to an environment comprising nitride, and a top portion of the silicon layer 88 exposed by the pattern 139 may be converted into a silicon nitride region through chemical reactions. For example, a plasma process using a nitrogen containing plasma may be performed to convert a top portion of the silicon layer 88 into silicon nitride regions, which act as the mask layer 89'. An etch selectivity between the metal gates 97 and the mask layer 89 (or 89') may be higher than a pre-determined threshold (e.g., about 2).

Figure 23:
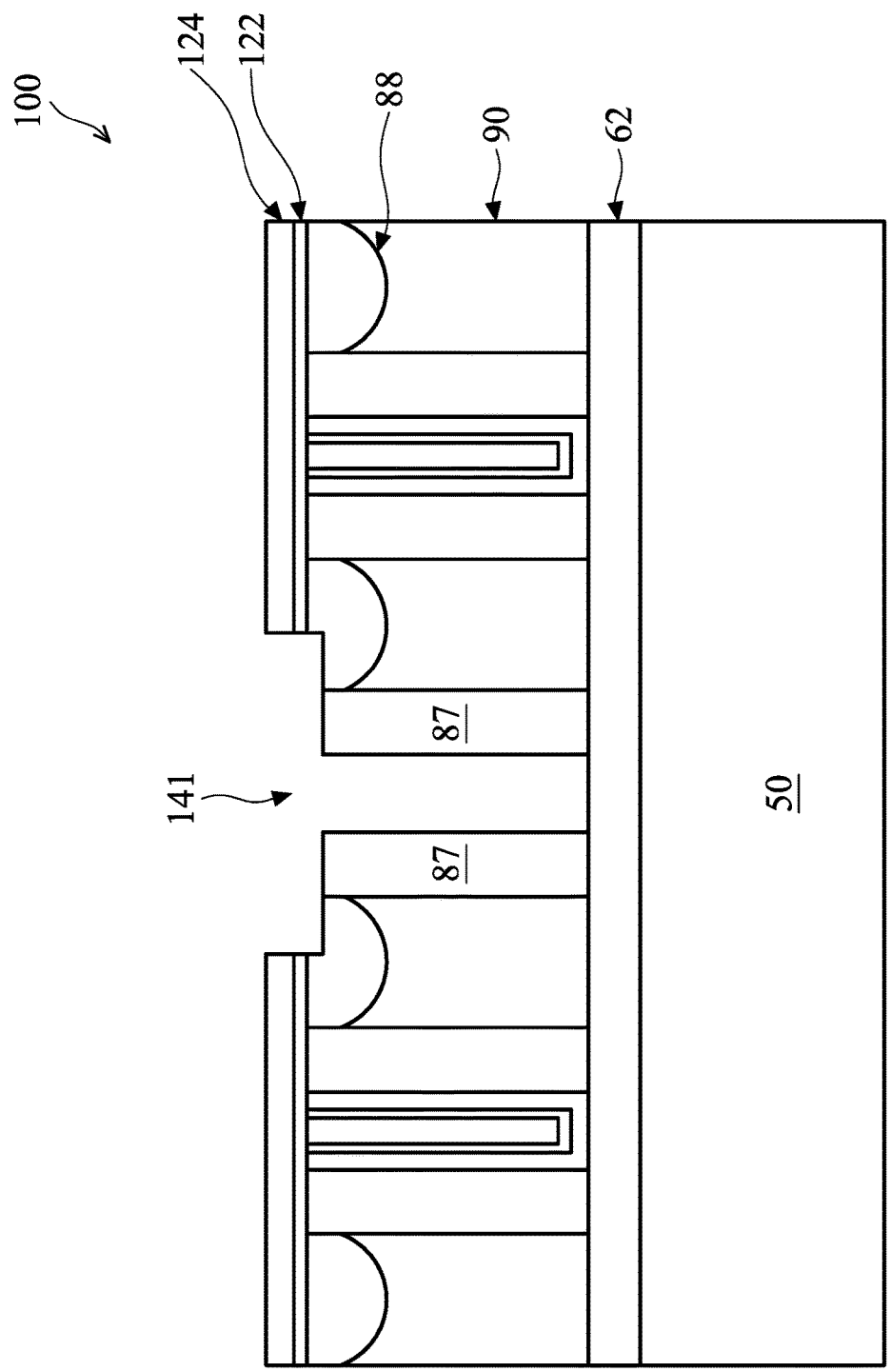

Next, in FIG. 23, portions of the metal gate 97B within the cut area 55 (see FIG. 9) are removed. The removal of the portions of the metal gate 97B may use the same method described above with reference to FIG. 15A, details are not repeated here. The recess 141 is formed after the removal of the portions of the metal gate 97B.

Figure 24:
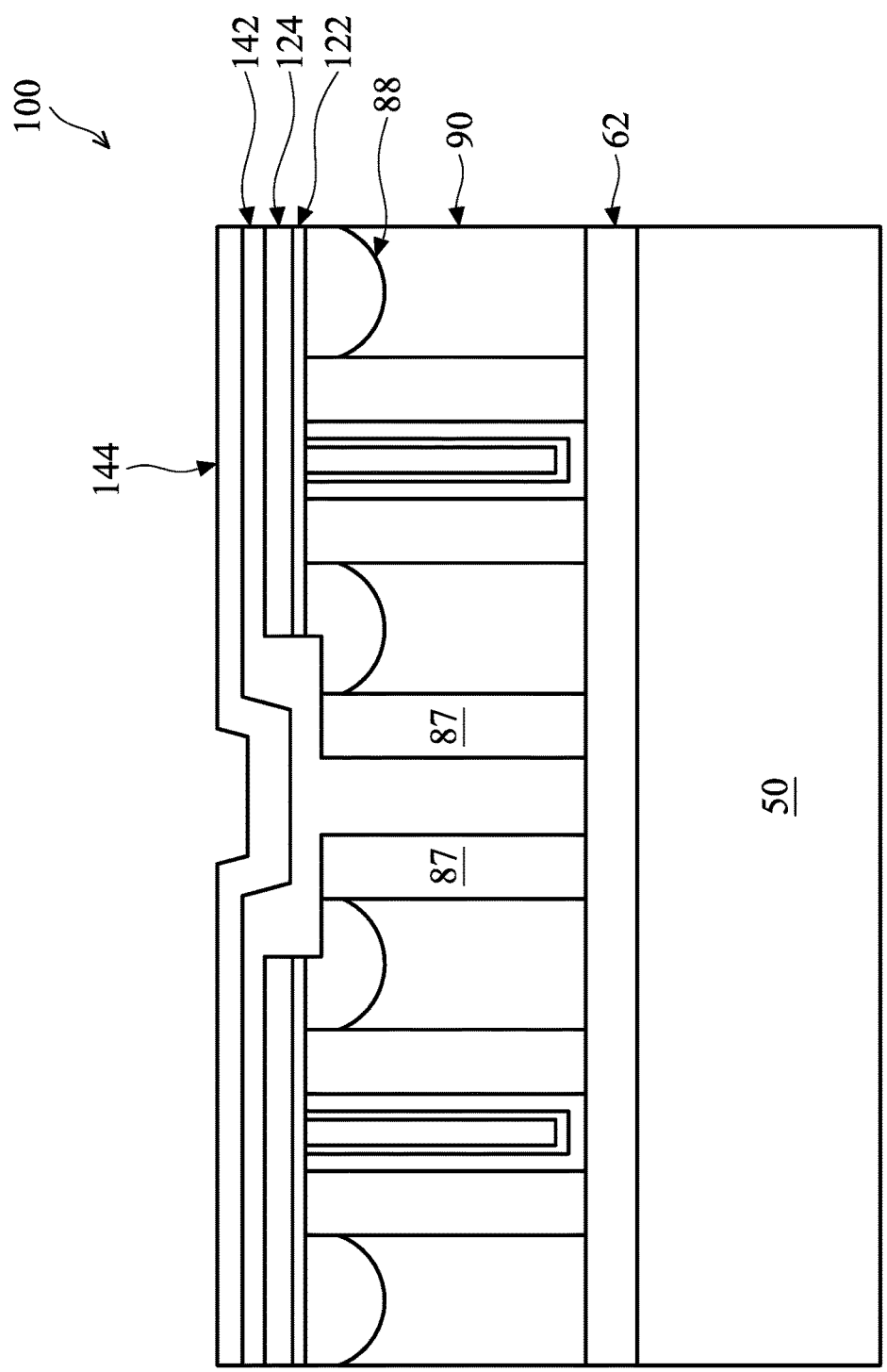

Next, in FIG. 24, the recess 141 is filled with a dielectric material. In some embodiments, the recess 141 is filled by the first dielectric layer 142 and the second dielectric layer 144. In some embodiments, the first dielectric layer 142 and the second dielectric layer 144 comprise a same material formed by different deposition methods. Details are similar to those discussed above with reference to FIGS. 16A and 16B, thus are not repeated here. Next, contacts 102 (not shown) are formed, following similar processing as illustrated in FIGS. 17A-18B.

FIGS. 25-29 illustrate cross-sectional views of the FinFET device 100 along cross-section C-C at various stages of processing, in accordance with yet another embodiment. For example, FIGS. 2-7, 25-29, and 17A-18B illustrate processing steps to form a FinFET device 100 in another embodiment.

Figure 25:
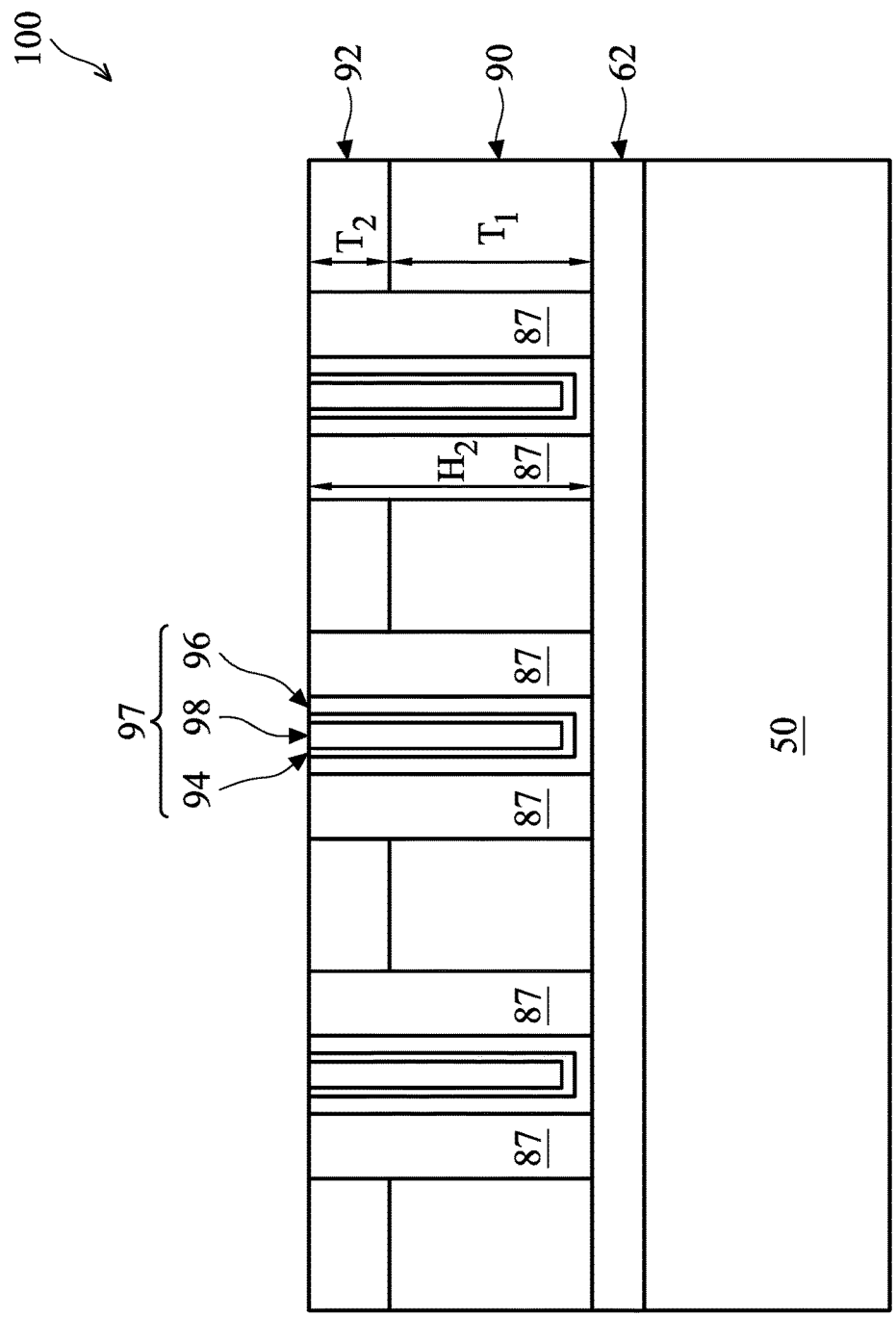
FIG. 25-29 illustrate cross-sectional views of a FinFET device at various stages of fabrication, in accordance with an embodiment.

Referring to FIG. 25, after the source/drain regions 80 are formed as illustrated in FIG. 7, a dual-layered ILD structure comprising a first ILD 90 and a mask layer 92 is formed. The first ILD 90 may comprise a same material as the first ILD 90 in FIG. 8, and may be formed using a similar deposition method, thus details are not repeated. As illustrated in FIG. 25, a thickness T1 of the first ILD 90 is smaller than a height H2 of the metal gate 97. The thickness T1 may be between about 60 nm and about 120 nm, such as 90 nm, as an example.

After the first ILD 90 is formed, the mask layer 92 is formed over the first ILD 90. The mask layer 92 may comprise a same masking material as the mask layer 85 in FIG. 12A, e.g., silicon nitride, carbon, cobalt, LaO, LaSiO, or Y2O3, and may be formed by CVD, PVD, or the like. An etch selectivity between the metal gates 97 and the mask layer 92 may be higher than a pre-determined threshold (e.g., two). In some embodiments, a thickness $T_2$ of the mask layer 92 may be in a range from about 20 nm to about 40 nm. After being deposited, the mask layer 92 may be planarized by, e.g., a CMP process, to expose the upper surface of the metal gates 97. Note that compared with the example of FIG. 12A, the mask layer 92 in FIG. 25 is deposited over the first ILD 90 without the processing step of removing top portion of the first ILD 90 to form the recesses 82 (see FIG. 11A). In an embodiment, an etch selectivity between the metal gate 97 and the mask layer 92 may be chosen to be equal to larger than a ratio of H2/T2 (e.g., a ratio of two). For example, the material(s) of the mask layer 92, or the composition of the mask layer 92 (e.g., at % of Si in LaSiO), may be varied to accommodate the dimensions (e.g., H2, T2) of the FinFET device 100.

Figure 26:
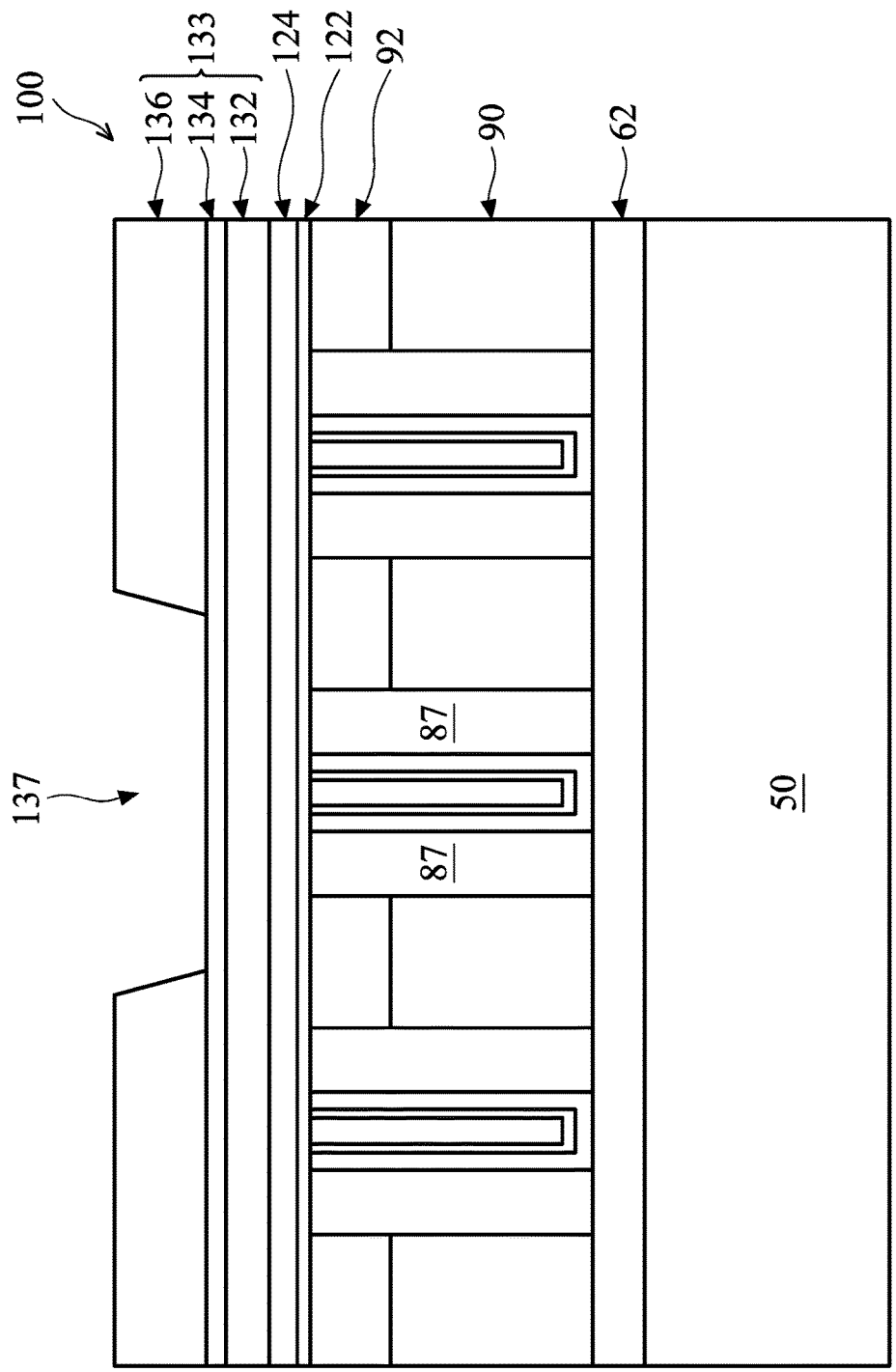

Next, in FIG. 26, the first hard mask layer 122, the second hard mask layer 124, and the tri-layered photoresist 133, which comprises the top photoresist layer 136, the middle layer 134, and the bottom anti-reflective coating (BARC) layer 132, are formed consecutively over the structure shown in FIG. 25. The materials and the formation methods of the first hard mask layer 122, the second hard mask layer 124, and the tri-layered photoresist 133 are similar to those in FIG. 13A, details are not repeated here. As illustrated in FIG. 26, the pattern 137 (e.g., an opening) is formed in the top photoresist layer 136 by a photolithography process.

Figure 27:
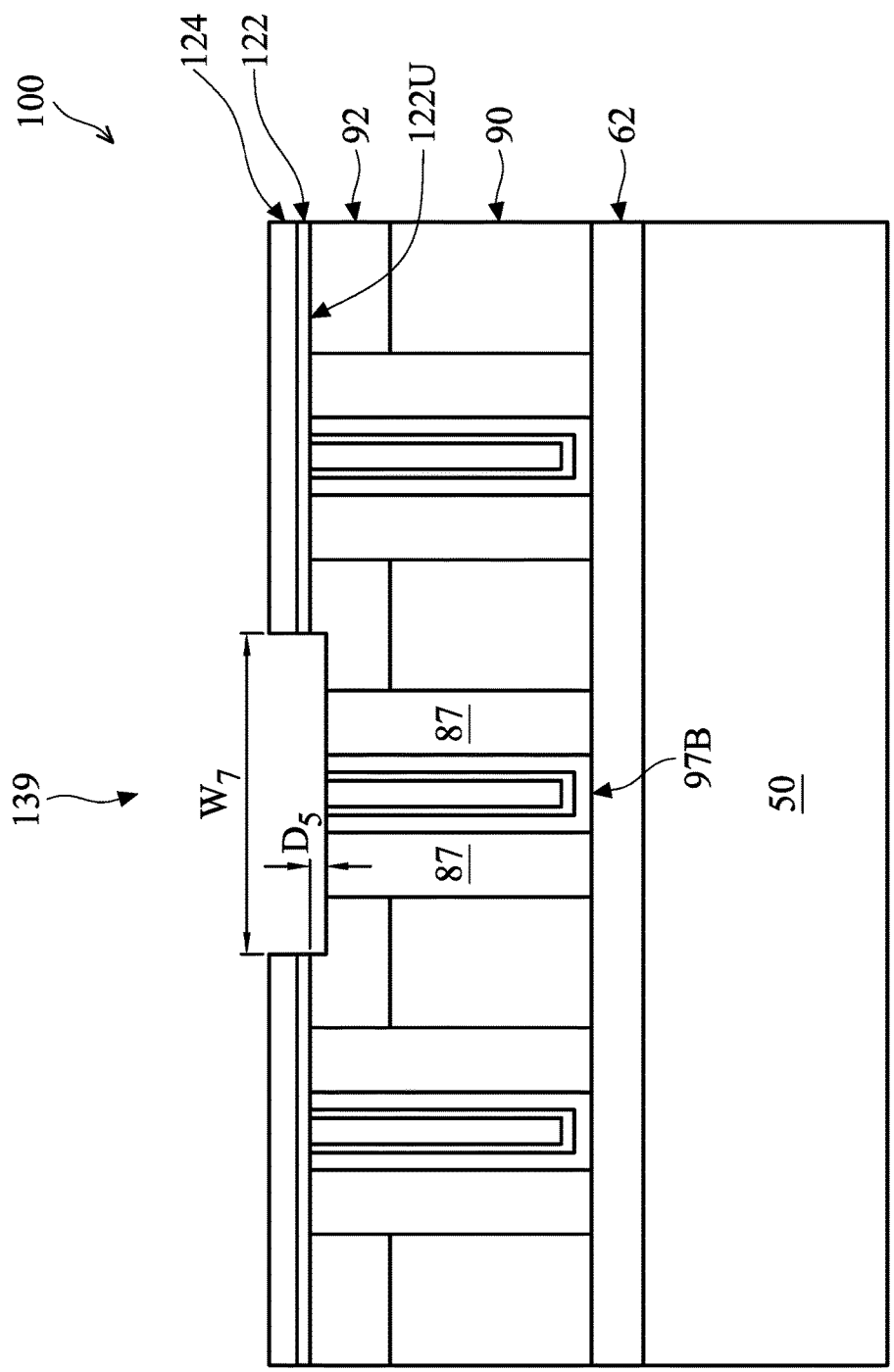

Next, as illustrated in FIG. 27, the pattern 137 is transferred to the first hard mask layer 122 and the second hard mask layer 124. The pattern 139 (e.g., an opening) is formed exposing the metal gate 97B, the gate spacers 87 on sidewalls of the metal gate 97B, and portions of the mask layer 92 adjacent the metal gate 97B. The process to form the pattern 139 may recess the upper surface of the metal gate 97B, the upper surfaces of the respective gate spacers 87, and the upper surface of the mask layer 92 directly below the pattern 139. The recessed upper surfaces of the metal gate 97B, the recessed upper surfaces of the respective gate spacers 87, and the recessed upper surface of the mask layer 92 may be coplanar. In some embodiments, a width $W_7$ of the pattern 139 is between about 20 nm to about 60 nm, such as 40 nm. An offset $D_5$ between the lower surface 122U of the first hard mask layer 122 and the recessed upper surface of the mask layer 92, is between about 5 nm and about 30 nm, such as 15 nm.

Figure 28:
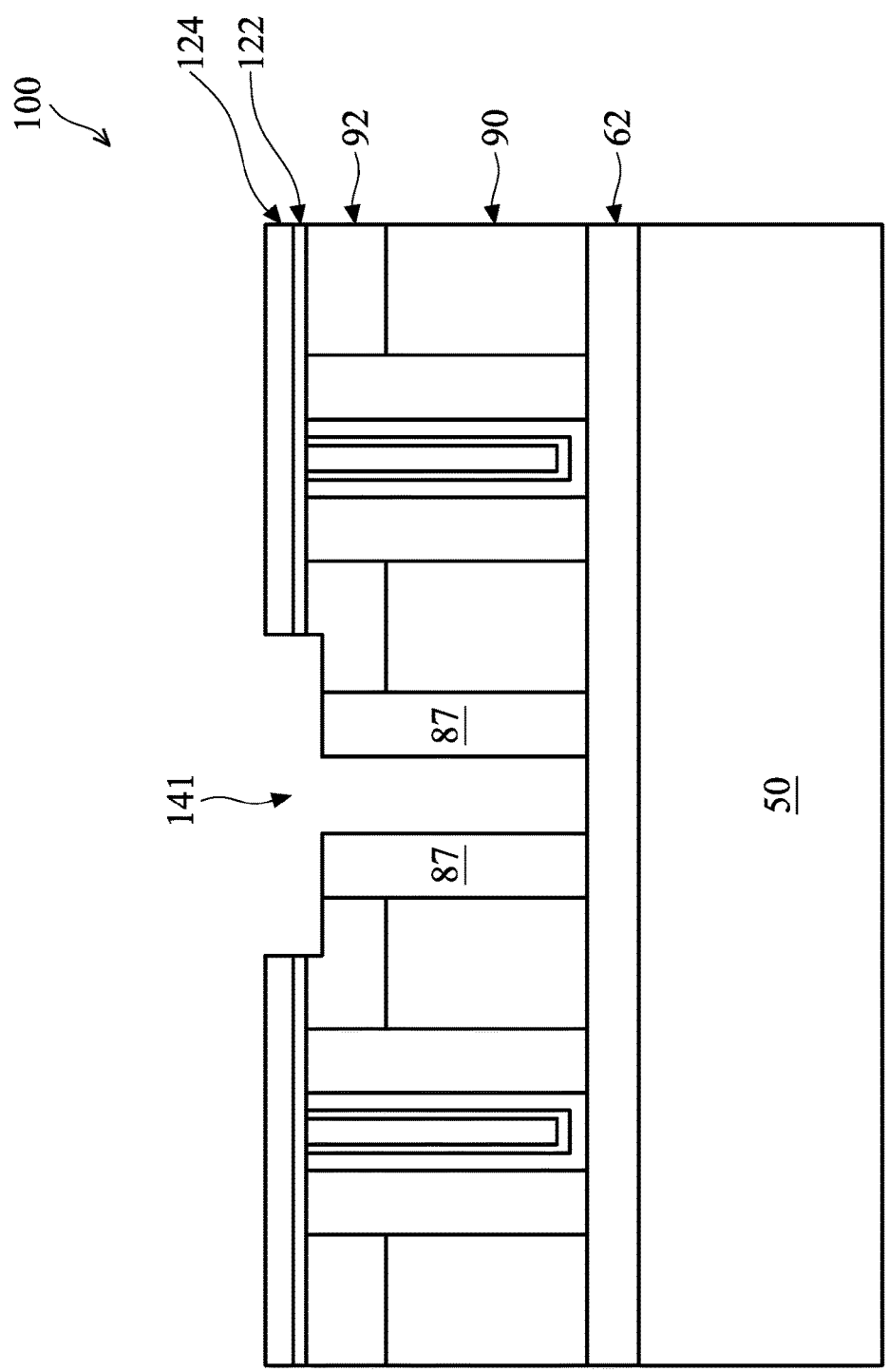

Next, in FIG. 28, portions of the metal gate 97B within the cut area 55 (see FIG. 9) are removed. The removal of the portions of the metal gate 97B may use the same method described above with reference to FIG. 15A, details are not repeated here. A recess 141 is formed after the removal of the portions of the metal gate 97B in the cut area 55.

Figure 29:
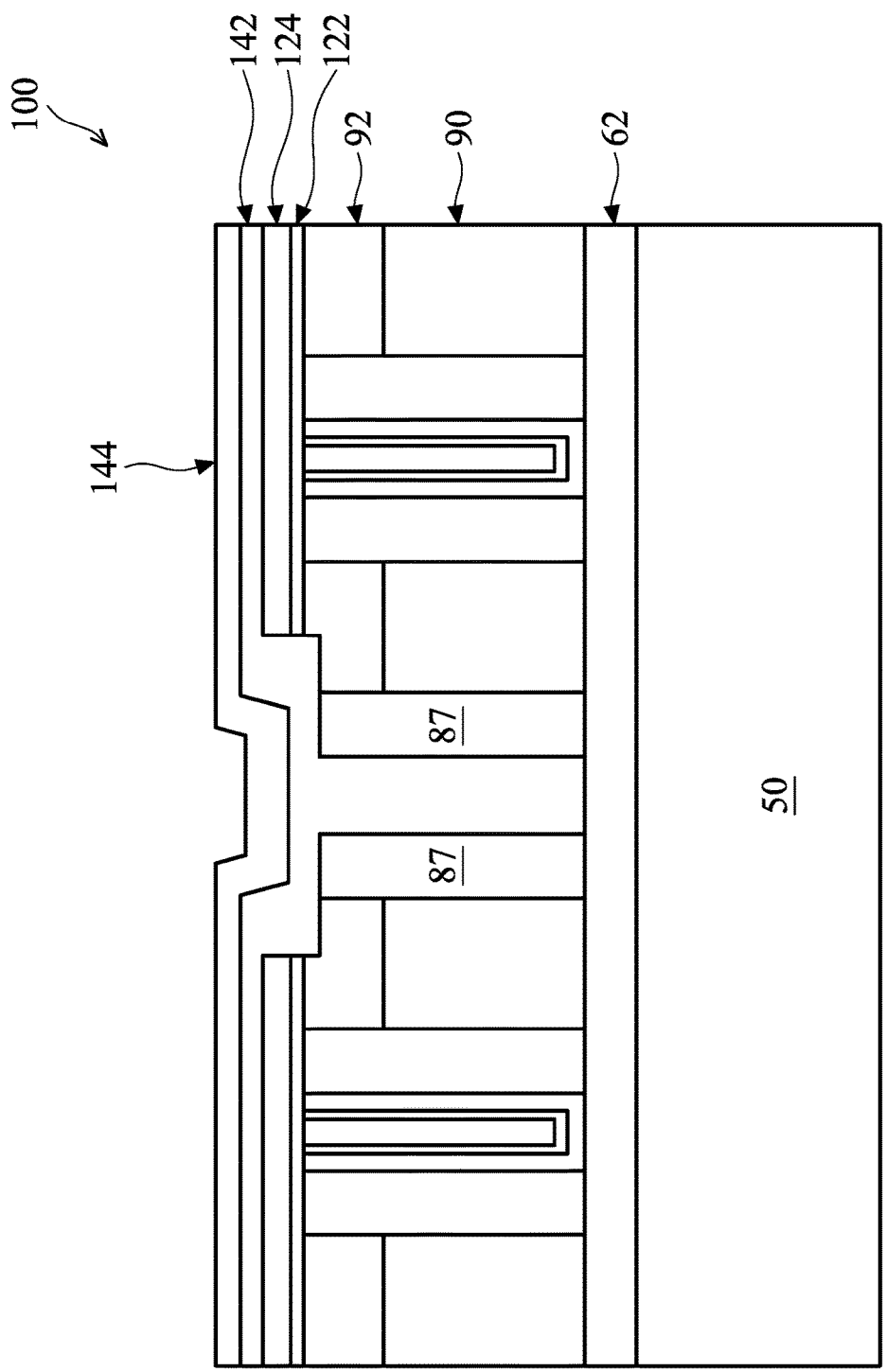

Next, in FIG. 29, the recess 141 is filled with a dielectric material. In some embodiments, the recess 141 is filled by a first dielectric layer 142 and a second dielectric layer 144. In some embodiments, the first dielectric layer 142 and the second dielectric layer 144 comprises a same material formed by different deposition methods. Details are similar to those discussed above with reference to FIGS. 16A and 16B, thus are not repeated here. Next, contacts 102 are formed, following similar processing as illustrated in FIGS. 17A-18B.

Figure 30:
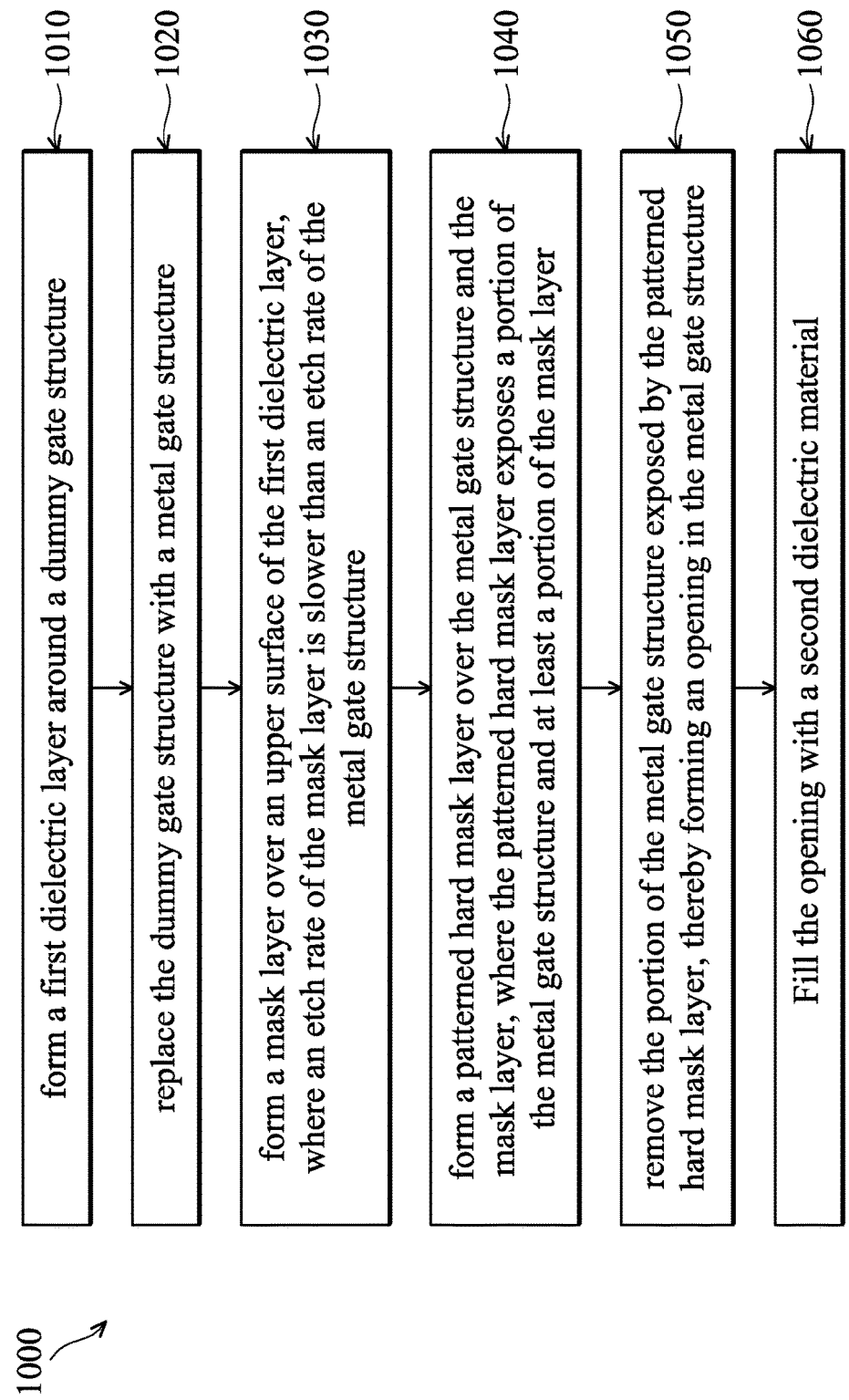
FIG. 30 illustrates a flow chart of a method of fabricating a semiconductor device, in accordance with some embodiments.

FIG. 30 illustrates a flow chart of a method of fabricating a semiconductor device, in accordance with some embodiments. It should be understood that the embodiment method shown in FIG. 30 is merely an example of many possible embodiment methods. One of ordinary skill in the art would recognize many variations, alternatives, and modifications. For example, various steps as illustrated in FIG. 30 may be added, removed, replaced, rearranged and repeated.

Referring to FIG. 30, at step 1010, a first dielectric layer is formed around a dummy gate structure. At step 1020, the dummy gate structure is replaced with a metal gate structure. At step 1030, a mask layer is formed over an upper surface of the first dielectric layer, where an etch rate of the mask layer is slower than an etch rate of the metal gate structure. At step 1040, a patterned hard mask layer is formed over the metal gate structure and the mask layer, where the patterned hard mask layer exposes a portion of the metal gate structure and at least a portion of the mask layer. At step 1050, the portion of the metal gate structure exposed by the patterned hard mask layer is removed, thereby forming an opening in the metal gate structure. At step 1060, the opening is filled with a second dielectric material.

Embodiments may achieve advantages. The present disclosure reduces or prevents the loss of the first ILD 90 during the metal gate cutting process. Since excessive loss of the first ILD 90 may damage the epitaxial source/drain regions, the present disclosure also prevents or reduces the damage of the epitaxial source/drain regions.

In an embodiment, a method includes forming a first dielectric material around a dummy gate structure; replacing the dummy gate structure with a metal gate structure; forming a mask layer over an upper surface of the first dielectric material, wherein an etch rate of the mask layer is slower than an etch rate of the metal gate structure; forming a patterned hard mask layer over the metal gate structure and the mask layer, wherein the patterned hard mask layer exposes a portion of the metal gate structure and at least a portion of the mask layer; removing the portion of the metal gate structure exposed by the patterned hard mask layer, thereby forming an opening in the metal gate structure; and filling the opening with a second dielectric material. In an embodiment, a ratio of the etch rate of the metal gate structure to the etch rate of the mask layer is above a pre-determined threshold of two. In an embodiment, the mask layer includes silicon nitride (SiN), carbon (C), lanthanum oxide (LaO), lanthanum silicon oxide (LaSiO), yttrium oxide ($Y_2O_3$), cobalt (Co), the like, or combinations thereof. In an embodiment, forming the mask layer includes removing top portions of the first dielectric material, thereby forming recesses in the first dielectric material; and filling the recesses with at least one material. In an embodiment, filling the recesses deposits the at least one material in the recesses and over the metal gate structure, wherein the method further includes performing a planarization process to expose an upper surface of the metal gate structure. In an embodiment, filling the recesses with at least one material includes conformally forming a first material in the recesses; and filling the recesses with a second material after conformally forming the first material, wherein a first etch rate of the first material and a second etch rate of the second material are slower than the etch rate of the metal gate structure, wherein the first etch rate is different from the second etch rate. In an embodiment, forming the mask layer includes removing top portions of the first dielectric material, thereby forming recesses in the first dielectric material; filling the recesses with silicon; and after forming the patterned hard mask layer, selectively forming silicon nitride over a portion of the silicon exposed by the patterned hard mask layer. In an embodiment, before removing the portion of the metal gate structure, an upper surface of the mask layer is level with the upper surface of the metal gate structure. In an embodiment, forming the patterned hard mask layer includes forming a first hard mask layer over the metal gate structure; forming a second hard mask layer over the first hard mask layer; forming a photo-sensitive layer over the second hard mask layer; patterning the photo-sensitive layer; and transferring a pattern of the photo-sensitive layer to the first hard mask layer and the second hard mask layer. In an embodiment, the photo-sensitive layer is a tri-layered photoresist including a top photoresist layer, a middle layer, and a bottom anti-reflective coating layer, wherein the tri-layered photoresist is formed over the second hard mask layer. In an embodiment, filling the opening with the second dielectric material includes depositing a first layer having the second dielectric material using a first deposition method; and depositing a second layer having the second dielectric material over the first layer using a second deposition method different from the first deposition method. In an embodiment, the second dielectric material is silicon nitride, wherein the first deposition method is atomic layer deposition (ALD), and the second deposition method is plasma-enhanced chemical vapor deposition (PECVD).

In an embodiment, a method includes forming a metal gate structure over a fin, wherein the metal gate structure is surrounded by a first dielectric material; forming a capping layer over the first dielectric material, wherein an etch selectivity between the metal gate structure and the capping layer is over a pre-determined threshold; forming a patterned hard mask layer over the metal gate structure and the capping layer, wherein an opening of the patterned hard mask layer exposes a portion of the metal gate structure and a portion of the capping layer; and removing the portion of the metal gate structure exposed by the opening of the patterned hard mask layer. In an embodiment, the method further includes filling a recess in the metal gate structure with a second dielectric material, wherein the recess is formed by removing the portion of the metal gate structure. In an embodiment, forming the capping layer includes replacing top portions of the first dielectric material with the capping layer. In an embodiment, forming the capping layer includes replacing top portions of the first dielectric material with silicon; and after forming the patterned hard mask layer, selectively forming the capping layer over portions of the silicon exposed by the opening of the patterned hard mask layer.

In an embodiment, a method of forming a Fin-field Effect Transistor (FinFET) device includes forming a first fin and a second fin, the first fin being substantially parallel with the second fin; forming a dummy gate over the first fin and the second fin, the dummy gate having gate spacers; forming an inter-layer dielectric (ILD) layer around the dummy gate; replacing the dummy gate with a metal gate; forming a capping layer over an upper surface of the ILD layer, the capping layer having a first etch rate that is slower than a second etch rate of the metal gate; forming a hard mask layer over the capping layer; patterning the hard mask layer to form a first opening between the first fin and the second fin, the first opening exposing the metal gate and the capping layer; and removing portions of the metal gate exposed by the first opening of the hard mask layer. In an embodiment, the capping layer includes a first layer and a second layer, wherein the first layer and the second layer comprise a same material, wherein the first layer is formed by a first deposition method, and the second layer is formed by a second deposition method different from the first deposition method. In an embodiment, forming the capping layer includes recessing the ILD layer to form recesses; filling the recesses of the ILD layer with a first material; and performing a planarization process to recess the first material and to expose an upper surface of the metal gate, wherein the first material after the planarization process forms the capping layer. In an embodiment, removing portions of the metal gate produces a second opening in the metal gate, wherein the method further comprises filling the second opening of the metal gate with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric material around a dummy gate structure;
    replacing the dummy gate structure with a metal gate structure;
    forming a mask layer over an upper surface of the first dielectric material, wherein an etch rate of the mask layer is slower than an etch rate of the metal gate structure;
    forming a patterned hard mask layer over the metal gate structure and the mask layer, wherein the patterned hard mask layer exposes a portion of the metal gate structure and at least a portion of the mask layer;
    removing the portion of the metal gate structure exposed by the patterned hard mask layer, thereby forming an opening in the metal gate structure; and
    filling the opening with a second dielectric material.

2. The method of claim 1, wherein a ratio of the etch rate of the metal gate structure to the etch rate of the mask layer is above a pre-determined threshold of two.

3. The method of claim 1, wherein the mask layer comprises silicon nitride (SiN), carbon (C), lanthanum oxide (LaO), lanthanum silicon oxide (LaSiO), yttrium oxide ($Y_2O_3$), cobalt (Co), the like, or combinations thereof.

4. The method of claim 1, wherein forming the mask layer comprises:
    removing top portions of the first dielectric material, thereby forming recesses in the first dielectric material; and
    filling the recesses with at least one material.

5. The method of claim 4, wherein filling the recesses deposits the at least one material in the recesses and over the metal gate structure, wherein the method further comprises performing a planarization process to expose an upper surface of the metal gate structure.

6. The method of claim 4, wherein filling the recesses with at least one material comprises:
    conformally forming a first material in the recesses; and
    filling the recesses with a second material after conformally forming the first material, wherein a first etch rate of the first material and a second etch rate of the second material are slower than the etch rate of the metal gate structure, wherein the first etch rate is different from the second etch rate.

7. The method of claim 1, wherein before removing the portion of the metal gate structure, an upper surface of the mask layer is level with the upper surface of the metal gate structure.

8. The method of claim 1, wherein forming the patterned hard mask layer comprises:
    forming a first hard mask layer over the metal gate structure;
    forming a second hard mask layer over the first hard mask layer;
    forming a photo-sensitive layer over the second hard mask layer;
    patterning the photo-sensitive layer; and
    transferring a pattern of the photo-sensitive layer to the first hard mask layer and the second hard mask layer.

9. The method of claim 8, wherein the photo-sensitive layer is a tri-layered photoresist comprising a top photoresist layer, a middle layer, and a bottom anti-reflective coating layer, wherein the tri-layered photoresist is formed over the second hard mask layer.

10. The method of claim 1, wherein filling the opening with the second dielectric material comprises:
    depositing a first layer comprising the second dielectric material using a first deposition method; and
    depositing a second layer comprising the second dielectric material over the first layer using a second deposition method different from the first deposition method.

11. The method of claim 10, wherein the second dielectric material is silicon nitride, wherein the first deposition method is atomic layer deposition (ALD), and the second deposition method is plasma-enhanced chemical vapor deposition (PECVD).

12. A method comprising:
    forming a metal gate structure over a fin, wherein the metal gate structure is surrounded by a first dielectric material;

forming a capping layer over the first dielectric material, wherein an etch selectivity between the metal gate structure and the capping layer is over a pre-determined threshold;

forming a patterned hard mask layer over the metal gate structure and the capping layer, wherein an opening of the patterned hard mask layer exposes a portion of the metal gate structure and a portion of the capping layer; and removing the portion of the metal gate structure exposed by the opening of the patterned hard mask layer.

13. The method of claim 12, further comprising filling a recess in the metal gate structure with a second dielectric material, wherein the recess is formed by removing the portion of the metal gate structure.

14. The method of claim 12, wherein forming the capping layer comprises replacing top portions of the first dielectric material with the capping layer.

15. A method of forming a Fin-field Effect Transistor (FinFET) device comprising:

forming a first fin and a second fin, the first fin being substantially parallel with the second fin;

forming a dummy gate over the first fin and the second fin, the dummy gate having gate spacers;

forming an inter-layer dielectric (ILD) layer around the dummy gate;

replacing the dummy gate with a metal gate;

forming a capping layer over an upper surface of the ILD layer, the capping layer having a first etch rate that is slower than a second etch rate of the metal gate;

forming a hard mask layer over the capping layer;

patterning the hard mask layer to form a first opening between the first fin and the second fin, the first opening exposing the metal gate and the capping layer; and removing portions of the metal gate exposed by the first opening of the hard mask layer.

16. The method of claim 15, wherein the capping layer comprises a first layer and a second layer, wherein the first layer and the second layer comprise a same material, wherein the first layer is formed by a first deposition method, and the second layer is formed by a second deposition method different from the first deposition method.

17. The method of claim 15, wherein forming the capping layer comprises:

recessing the ILD layer to form recesses;

filling the recesses of the ILD layer with a first material; and performing a planarization process to remove a portion of the first material and to expose an upper surface of the metal gate, wherein the first material after the planarization process forms the capping layer.

18. The method of claim 15, wherein removing portions of the metal gate produces a second opening in the metal gate, wherein the method further comprises filling the second opening of the metal gate with a dielectric material.

19. The method of claim 6, wherein the first etch rate is slower than the second etch rate.

20. The method of claim 12, further comprising adjusting a composition of the capping layer in accordance with a ratio between a height of the metal gate structure and a height of the capping layer.

* * * * *